(12) United States Patent  (10) Patent No.: US 7,692,764 B2
Shirata  (45) Date of Patent: Apr. 6, 2010

(54) EXPOSURE APPARATUS, OPERATION DECISION METHOD, SUBSTRATE PROCESSING SYSTEM, MAINTENANCE MANAGEMENT METHOD, AND DEVICE MANUFACTURING METHOD

(75) Inventor: Yousuke Shirata, Saitama (JP)

(73) Assignee: Nikon Corporation, Tokyo (JP)

(*) Notice: Subject to any disclaimer, the term of this patent is extended or adjusted under 35 U.S.C. 154(b) by 406 days.

(21) Appl. No.: 11/660,906

(22) PCT Filed: Aug. 29, 2005

(86) PCT No.: PCT/JP2005/015628

§ 371 (c)(1),
(2), (4) Date: Feb. 23, 2007

(87) PCT Pub. No.: WO2006/025302

PCT Pub. Date: Mar. 9, 2006

(65) Prior Publication Data

US 2007/0252966 A1 Nov. 1, 2007

(30) Foreign Application Priority Data

Aug. 30, 2004 (JP) ............................. 2004-249395

(51) Int. Cl.
*G03B 27/42* (2006.01)
*G03B 27/32* (2006.01)
*G03D 5/00* (2006.01)
*G06F 19/00* (2006.01)

(52) U.S. Cl. ...................... 355/53; 355/27; 396/611; 700/109; 700/121

(58) Field of Classification Search ................ 355/27, 355/53, 67, 77; 396/611; 700/100, 121, 700/109, 110; 438/14
See application file for complete search history.

(56) References Cited

U.S. PATENT DOCUMENTS 5,312,487 A 5/1994 Akimoto et al.

(Continued)

FOREIGN PATENT DOCUMENTS

JP 2-294013 12/1990

(Continued)

OTHER PUBLICATIONS

Office Action (Written Opinion and Search Report) issued by the Australian Patent Office in corresponding Patent Application No. SG 200701191-9; mailed on Apr. 8, 2008.

(Continued)

*Primary Examiner*—Alan A Mathews
(74) *Attorney, Agent, or Firm*—Staas & Halsey LLP

(57) ABSTRACT

An exposure apparatus is equipped with a main controller that decides an operation of the exposure apparatus based on information on maintenance from a C/D. Therefore, the main controller can decide to perform a specific operation, which is necessary for maintaining performance of the exposure apparatus and requires stop of the primary operation of the exposure apparatus, during maintenance of the C/D, that is, when the primary operation of the exposure apparatus has to be stopped by necessity, in parallel with the maintenance of the C/D. As a consequence, downtime of the exposure apparatus necessary for performing the specific operation can be decreased as a whole, which makes it possible to improve the operating rate without lowering apparatus performance of the exposure apparatus that is inline connected to a substrate processing apparatus.

19 Claims, 6 Drawing Sheets

U.S. PATENT DOCUMENTS

| | | |
|---|---|---|
| 5,383,217 A | 1/1995 | Uemura |
| 5,820,679 A | 10/1998 | Yokoyama et al. |
| 5,858,863 A | 1/1999 | Yokoyama et al. |
| 6,099,598 A | 8/2000 | Yokoyama et al. |
| 6,219,367 B1 | 4/2001 | Atsumi |
| 6,287,023 B1 | 9/2001 | Yaegashi et al. |
| 6,385,497 B1 * | 5/2002 | Ogushi et al. ............ 700/110 |
| 6,698,944 B2 | 3/2004 | Fujita |
| 6,819,414 B1 | 11/2004 | Takeuchi |
| 6,879,866 B2 | 4/2005 | Tel et al. |
| 6,889,014 B2 | 5/2005 | Takano |
| 7,062,344 B2 | 6/2006 | Yokoyama et al. |
| 7,102,748 B2 | 9/2006 | De Vries |
| 2002/0041377 A1 | 4/2002 | Hagiwara et al. |
| 2003/0013213 A1 | 1/2003 | Takano |
| 2006/0111802 A1 | 5/2006 | Yokoyama et al. |
| 2006/0111805 A1 | 5/2006 | Yokoyama et al. |

FOREIGN PATENT DOCUMENTS

| | | |
|---|---|---|
| JP | 5-82435 | 4/1993 |
| JP | 6-291006 | 10/1994 |
| JP | 8-51067 | 2/1996 |
| JP | 10-275951 | 10/1998 |
| JP | 10-335415 | 12/1998 |
| JP | 11-040490 | 2/1999 |
| JP | WO 99/08315 | 2/1999 |
| JP | 11-67655 | 3/1999 |
| JP | 11-156132 | 6/1999 |
| JP | WO 99/60361 | 11/1999 |
| JP | 2001-6999 | 1/2001 |
| JP | 2002-048527 | 2/2002 |
| JP | 2002-75853 | 3/2002 |
| JP | 2002-198303 | 7/2002 |
| JP | 2003-22962 | 1/2003 |
| JP | 2005-57290 | 3/2005 |
| JP | 2005-72602 | 3/2005 |
| JP | 3654597 | 6/2005 |
| JP | 2005-317686 | 11/2005 |
| WO | WO 02/054462 | 7/2002 |

OTHER PUBLICATIONS

International Search Report, mailed Dec. 27, 2005 and issued in corresponding International Patent Application No. PCT/JP2005/015628.

English Translation of WIPO Publication WO 02/054462, published on Jul. 11, 2002.

English Translation of Japanese Patent Application No. 2002-048527, published on Feb. 15, 2002.

English Translation of Japanese Patent Application No. 11-040490, published on Feb. 12, 1999.

English Translation of Japanese Patent Application 2001-6999, published on Jan. 12, 2001.

English Translation of Japanese Patent Application No. 6-291006, published Oct. 18, 1994.

English Translation of Japanese Patent Application No. 8-51067, published on Feb. 20, 1996.

English Translation of Japanese Patent Application No. 10-335415, published on Dec. 18, 1998.

English Translation of Japanese Patent Application No. 2005-317686, published on Nov. 10, 2005.

* cited by examiner

EXPOSURE APPARATUS, OPERATION DECISION METHOD, SUBSTRATE PROCESSING SYSTEM, MAINTENANCE MANAGEMENT METHOD, AND DEVICE MANUFACTURING METHOD

CROSS REFERENCE TO RELATED APPLICATIONS

This application claims the benefit under 35 U.S.C. §371, of PCT International Application Number PCT/JP2005/015628, filed Aug. 29, 2005, and Japanese Application No. 2004-249395, filed Aug. 30, 2004 in Japan, the contents of which are incorporated herein by reference.

TECHNICAL FIELD

The present invention relates to exposure apparatuses, operation decision methods, substrate processing systems, maintenance management methods and device manufacturing methods, and more particularly, to an exposure apparatus that is inline connected to a substrate processing apparatus, an operation decision method in which an operation in the exposure apparatus is decided, a substrate processing system that is equipped with an exposure apparatus and a substrate processing apparatus that is inline connected to the exposure apparatus, a maintenance management method in which maintenance of each apparatus in the substrate processing system is managed, and a device manufacturing method in which the exposure apparatus and the system are used.

BACKGROUND ART

In a lithography process for manufacturing microdevices such as semiconductor devices (integrated circuits and the like) and liquid crystal display devices, besides an exposure process in which a predetermined pattern is formed on a substrate such as a wafer or a glass plate (hereinafter, generally referred to as a 'wafer') using an exposure apparatus, processes, which are performed before or after the exposure process, such as a resist coating process in which resist is coated on the surface of the wafer and a development process in which the wafer after exposure is developed are included.

Conventionally, in a lithography process, exposure by an exposure apparatus, resist coating by a resist coating unit (coater), development of a wafer using a developing unit (developer) and the like were performed separately. In recent years, in order to efficiently perform the exposure, resist coating and development described above as a series of processing in a clean environment, a system configuration in which an exposure apparatus and a coating/developing unit that is called a coater/developer (hereafter, shortened to a 'C/D') are inline connected has been relatively frequently employed. The C/D has both of a function of a resist coating unit such as a spin coater that falls drops of resist on a wafer while rotating the wafer at high speed and uniformly coats the resist on the wafer surface making use of rotation of the wafer, or a scan coater that relatively moves a nozzle and the wafer, and a function of a developing unit.

Accordingly, with the system configuration above, complication of loading a processing lot (a lot of wafers subject to processing) when each processing process such as the resist coating process, exposure process or development process is performed can be avoided, and in addition, throughput can be improved while maintaining chemical characteristics of chemically-amplified resist that is a type of high sensitive resist and has recently been frequently used, or the like.

Meanwhile, in order to improve the productivity of microdevices, the demand for improvement (increase) in an operating rate (uptime) with respect to the exposure apparatus is always existing. In order to meet the demand, efforts to decrease apparatus failure have also been continued. To decrease the failure, periodic maintenance is also important.

The demand for operating rate improvement of an exposure apparatus or the like is increasing year by year, and at present it is desired to achieve an operating rate of 95% or more.

However, it is not easy to achieve an operating rate of 95% or more even in the case of the exposure apparatus alone. The reason is that the demand for accuracy improvement and stabilization of a high accuracy state of the exposure apparatus is also increasing, to cope with higher integration of semiconductor devices. In other words, in order to meet the demand for exposure accuracy improvement and stabilization of a high accuracy state of the exposure apparatus, it becomes necessary to increase the frequency of periodic maintenance and also enhance self-calibration function of the exposure apparatus, which could increase, however, downtime of the exposure apparatus when a requested level becomes higher than a certain level.

Accordingly, in the system in which the exposure apparatus and the C/D are inline connected (hereinafter, referred to as an 'inline lithography system'), it can be said that it is extremely difficult to achieve an operating rate of 95% in the present situation. This is because in the inline lithography system, in the case the operation of the C/D is stopped for periodic maintenance, component replacement, or other reasons, the operation of the exposure apparatus has to be also stopped, and therefore, there are more factors to reduce an operating rate of the exposure apparatus, compared with the case of the exposure apparatus alone.

DISCLOSURE OF INVENTION

Problems to be Solved by the Invention

The present invention has been made in consideration of the situation described above, and has as its first object to provide an exposure apparatus that can improve an operating rate without lowering apparatus performance in the case the exposure apparatus is inline connected to a substrate processing apparatus.

The second object of the present invention is to provide an operation decision method that can improve an operating rate without lowering apparatus performance in the case an exposure apparatus is inline connected to a substrate processing apparatus.

The third object of the present invention is to provide a substrate processing system that can improve an operating rate while maintaining performance of the system.

The fourth object of the present invention is to provide a maintenance management method that can improve an operating rate while maintaining performance of the system.

The fifth object of the present invention is to provide a device manufacturing method that can improve productivity of high precision devices.

Means for Solving the Problems

According to a first aspect of the present invention, there is provided an exposure apparatus that is inline connected to a substrate processing apparatus, the exposure apparatus comprising: an operation decision unit that decides an operation of the exposure apparatus based on information on maintenance from the substrate processing apparatus.

This exposure apparatus is equipped with the operation decision unit that decides an operation of the exposure apparatus based on information on maintenance from the substrate processing apparatus, and therefore, the operation decision unit can decide to perform a specific operation that is necessary for maintaining performance of the exposure apparatus and requires stop of the primary operation of the exposure apparatus, during maintenance of the substrate processing apparatus (when the primary operation of the exposure apparatus has to be stopped by necessity) in parallel with the maintenance. As a consequence, downtime of the exposure apparatus that is necessary for performing the specific operation (which is also downtime of the substrate processing apparatus) can be decreased as a whole, which makes it possible to improve the operating rate without lowering apparatus performance of the exposure apparatus that is inline connected to the substrate processing apparatus.

Incidentally, the operation (i.e. the specific operation described above) of the exposure apparatus that the operation decision unit decides also includes an operation that is performed involving an operator after the operator or the like is notified, and the like, besides an operation that exposure apparatus itself performs.

In this case, information on maintenance from the substrate processing apparatus includes information on contents of maintenance work to be performed in the substrate processing apparatus, and the operation decision unit can decide an operation of the exposure apparatus in accordance with the contents of maintenance work. Further, information on maintenance from the substrate processing apparatus includes information on a period of time required for maintenance work to be performed in the substrate processing apparatus, and the operation decision unit can decide an operation of the exposure apparatus based on the period of time required for maintenance work.

Further, the operation of the exposure apparatus to be decided can include maintenance work.

In this case, the operation decision unit can decide to perform maintenance work of the exposure apparatus in parallel with at least a part of maintenance work of the substrate processing apparatus.

Further, in the case the operation of the exposure apparatus to be decided includes maintenance work, the maintenance work of the exposure apparatus can include maintenance work of a laser unit serving as a light source for exposure, or can also include work that does not involve exposure of a substrate, or can also include component replacement work.

According to a second aspect of the present invention, there is provided an operation decision method in which an operation in an exposure apparatus that is inline connected to a substrate processing apparatus is decided, the method including: a process of obtaining information on maintenance from the substrate processing apparatus; and a process of deciding an operation of the exposure apparatus based on the information.

With this method, since an operation of the exposure apparatus is decided based on information on maintenance from the substrate processing apparatus, it can be decided that an operation that is necessary for maintaining performance of the exposure apparatus is performed during maintenance of the substrate processing apparatus in parallel with the maintenance. As a consequence, downtime of the exposure apparatus can be decreased as a whole, which makes it possible to improve the operating rate without lowering apparatus performance of the exposure apparatus that is inline connected to the substrate processing apparatus.

Incidentally, an operation of the exposure apparatus also includes work that is performed involving an operator after the operator or the like is notified, and the like, besides work that exposure apparatus itself performs.

According to a third aspect of the present invention, there is provided a substrate processing system that comprises an exposure apparatus and a substrate processing apparatus that is inline connected to the exposure apparatus, the system comprising: a maintenance management unit that concertedly performs maintenance work of the exposure apparatus and maintenance work of the substrate processing apparatus.

This substrate processing system is equipped with the maintenance management unit that concertedly performs maintenance work of the exposure apparatus and maintenance work of the substrate processing apparatus. Therefore, unlike the case when maintenance work of the exposure apparatus and maintenance work of the substrate processing apparatus are independently performed, it becomes possible to improve the operating rate without lowering performance of the substrate processing system by the maintenance management unit optimizing the maintenance timing so that maintenance work of both apparatuses is performed in parallel wherever possible.

Incidentally, the maintenance work also includes work that is performed involving an operator after the operator or the like is notified, and the like, besides work that exposure apparatus itself performs.

In this case, the maintenance management unit can be either of a control computer equipped in the exposure apparatus or a control computer equipped in the substrate processing apparatus, and the maintenance management unit can also be a computer that is connected in common to the exposure apparatus and the substrate processing apparatus.

Further, the maintenance management unit can perform maintenance work of the substrate processing apparatus in parallel with at least a part of maintenance work of the exposure apparatus.

In the substrate processing system of the present invention, the exposure apparatus has a laser unit serving as an exposure light source, and maintenance work of the exposure apparatus can include maintenance work of the laser unit.

Further, in the substrate processing system of the present invention, the maintenance work can include component replacement work.

Further, the maintenance management unit retains information on component replacement timing of the exposure apparatus and information on component replacement timing of the substrate processing apparatus, and can optimize the timing of component replacement of each apparatus based on these pieces of information. Also, the maintenance management unit retains information on maintenance for which one apparatus requires the other apparatus and information on maintenance that can be individually performed by each apparatus, and can optimize the maintenance timing of each apparatus based on these pieces of information.

According to a fourth aspect of the present invention, there is provided a maintenance management method in which in a substrate processing system that comprises an exposure apparatus and a substrate processing apparatus that is inline connected to the exposure apparatus, maintenance work of each apparatus is managed, the method including: a process of obtaining information on maintenance of the exposure apparatus; a process of obtaining information on maintenance of the substrate processing apparatus; and a process of performing management so that the maintenance work in both of the apparatuses are concertedly performed based on both pieces of the information.

With this method, management is performed based on information on maintenance of the exposure apparatus and the substrate processing apparatus so that maintenance work of the exposure apparatus and maintenance work of the substrate processing apparatus are concertedly performed. Therefore, unlike the case where maintenance work of the exposure apparatus and maintenance work of the substrate processing apparatus are independently performed, the maintenance timing can be optimized so that maintenance work of both apparatuses is performed in parallel wherever possible. With this optimization, it becomes possible to improve the operating rate without lowering performance of the substrate processing system.

Incidentally, maintenance work also includes work that is performed involving an operator after the operator or the like is notified, and the like, besides work that exposure apparatus itself performs.

Further, in a lithography process, it is possible to improve the productivity of highly-integrated microdevices by forming a device pattern on a substrate, using the exposure apparatus of the present invention. Further, in a lithography process, it is possible to improve the productivity of highly-integrated microdevices by executing processing to a substrate that includes formation of a device pattern on the substrate, using the substrate processing system of the present invention. Accordingly, it can also be said from another aspect that the present invention is a device manufacturing method in which the exposure apparatus and the substrate processing system of the present invention are used.

BEST MODE FOR CARRYING OUT THE INVENTION

First Embodiment

A first embodiment of the present invention will be described below, referring to FIGS. 1 to 3.

Figure 1:
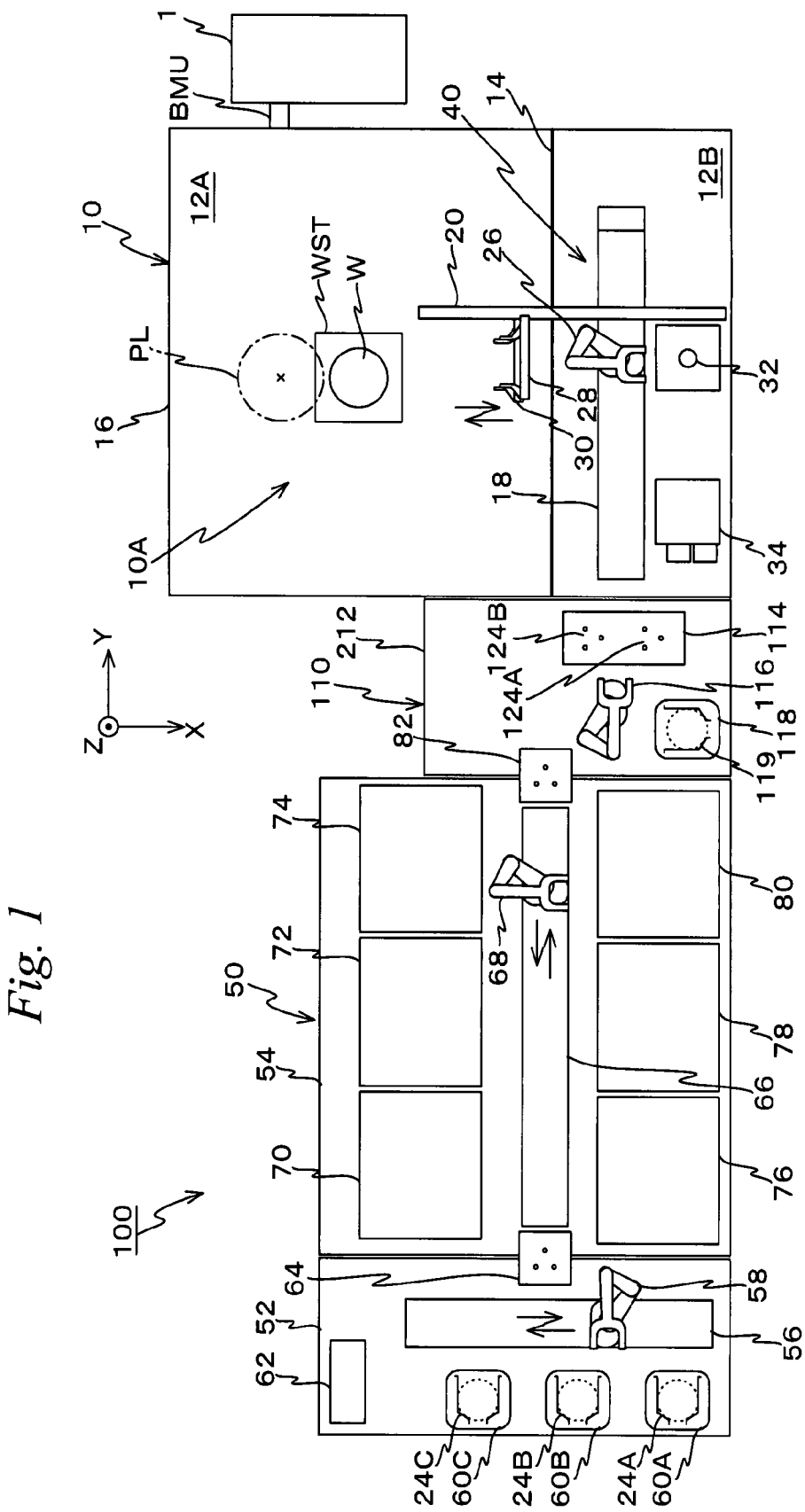
FIG. 1 is a planer view schematically showing the configuration of a lithography system related to a first embodiment of the present invention.

FIG. 1 is a planer view showing the configuration of a lithography system related to a first embodiment including an exposure apparatus and a substrate processing apparatus related to the present invention.

A lithograph system 100 shown in FIG. 1 is installed in a clean room. Lithography system 100 includes an exposure apparatus 10 installed on a floor surface of the clean room, and a C/D 50 that is connected to a −Y side (left side in the page surface of FIG. 1) of exposure apparatus 10 via an inline interface section (hereinafter, referred to as an 'inline I/F section) 100.

Exposure apparatus 10 includes a chamber 16 in which a partition wall 14 is arranged at a position that is slightly closer to a +X side from the center in an X-axis direction in FIG. 1, an exposure apparatus main section 10A (portions other than a wafer stage WST and a projection optical system PL are omitted in FIG. 1) that is housed inside a large room 12A on one side (−X side) in the X-axis direction partitioned by partition wall 14 inside chamber 16, and a wafer loader system 40 serving as a substrate transport system the most parts of which are housed inside a small room 12B on the other side (+X side) in the X-axis direction partitioned by partition wall 14 inside chamber 16. To exposure apparatus main section 10A, a laser unit 1 placed outside chamber 16 is connected via a light-transmitting optical system BMU.

Figure 2:
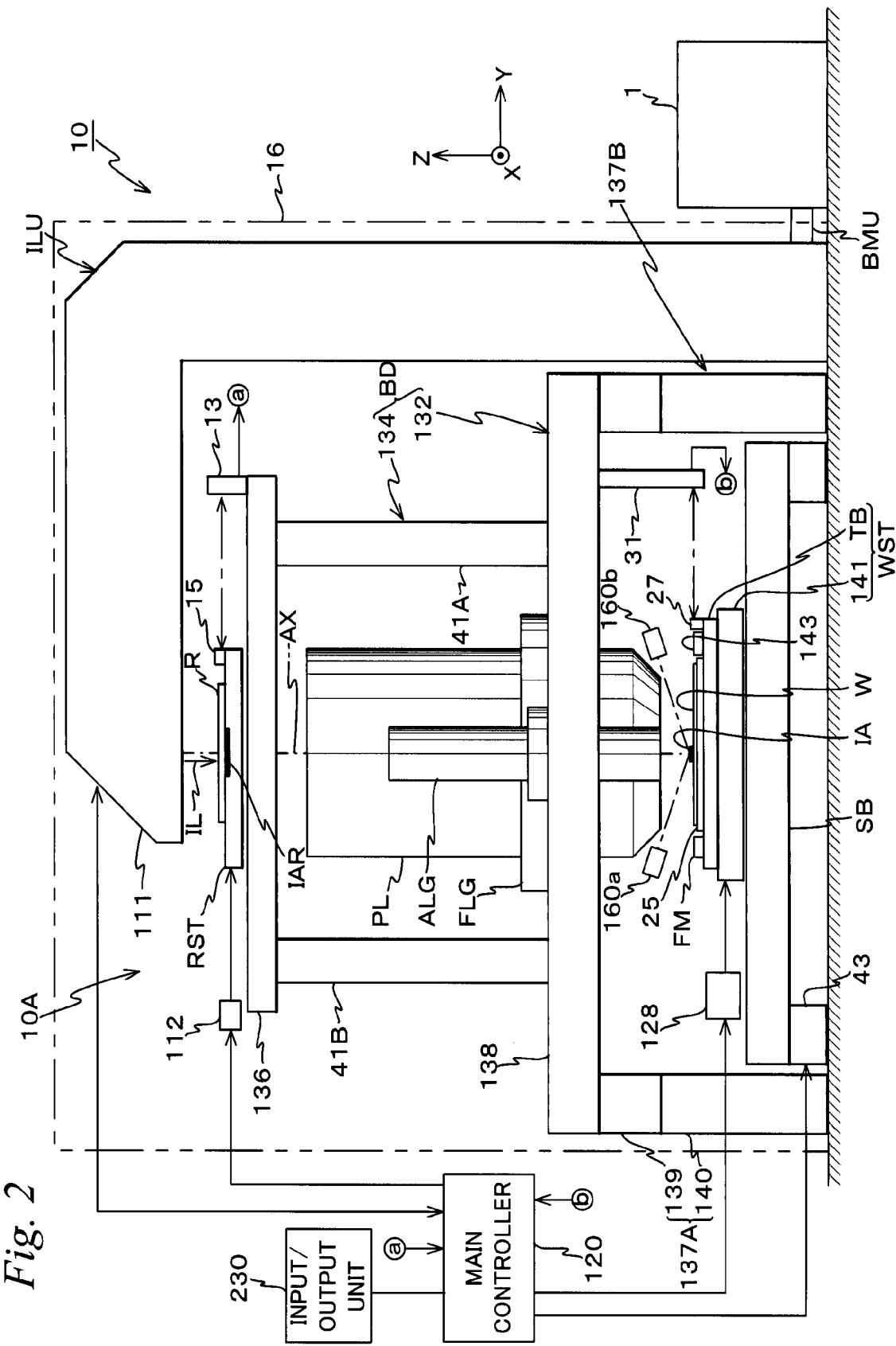
FIG. 2 is a view showing the configuration of an exposure apparatus in FIG. 1.

FIG. 2 is a front view schematically showing the configuration of exposure apparatus 10. In FIG. 2, chamber 16 is indicated by a virtual line (chain double-dashed line). Exposure apparatus 10 is a scanning projection exposure apparatus by a step-and-scan method, that is, a so-called scanner (which is also called a scanning stepper).

As laser unit 1, a pulse laser that oscillates a pulse light in a far-ultraviolet region such as a KrF excimer laser (oscillation wavelength: 248 nm) or an ArF excimer laser (oscillation wavelength: 193 nm) is used. Laser unit 1 is installed on the floor surface of the clean room where chamber 16 is installed. Incidentally, laser unit 1 can also be placed within another room (service room) that is different from the clean room and whose cleanliness degree is lower, or within a utility space below the floor surface. Incidentally, as laser unit 1, a vacuum ultraviolet light source such as an $F_2$ laser (oscillation wavelength: 157 nm) may be used, or an EUV light source may be used.

Exposure apparatus main section 10A includes an illumination unit ILU, a reticle stage RST that holds a reticle R as a mask, a projection optical system PL, a wafer stage WST that holds a wafer W and is freely movable within an XY plane, a body BD where reticle stage RST and projection optical system PL are mounted, a main controller 120 that performs overall control of the entire apparatus, and the like.

Illumination unit ILU includes an illumination system housing 111, and an illumination optical system that is composed of a beam shaping optical system, a rough energy adjuster, an optical integrator, an illumination system aperture stop plate, a beam splitter, a relay optical system and the like (none of which is shown). Further, inside the relay optical system of the illumination optical system, a field stop (which is also called a 'reticle blind' or a 'masking blade') that is made up of a fixed blind and a movable blind (not shown) is placed. Incidentally, as the optical integrator, a fly-eye lens, a rod-type (an internal reflection type) integrator, or a diffraction optical element is used.

To the beam shaping optical system that is arranged at an incidence end portion of illumination unit ILU, that is an incidence end portion of the illumination optical system, laser unit 1 is connected via a light-transmitting optical system BMU.

Illumination unit ILU illuminates an illumination area IAR (which is defined by an aperture of the fixed blind) that has a rectangular (e.g. oblong) slit shape extending an X-axis direction on reticle R held on reticle stage RST, with uniform illuminance distribution. The internal configuration of an illumination unit similar to this embodiment is disclosed in, for example, Kokai (Japanese Unexamined Patent Application Publication) No. 10-112433, Kokai (Japanese Unexamined Patent Application Publication) No. 06-349701, and the corresponding U.S. Pat. No. 5,534,970, and the like. As long as the national laws in designated states (or elected states), to which this international application is applied, permit, the disclosure of the above U.S. Patent is incorporated herein by reference.

Reticle stage RST is supported by levitation via a clearance of, for example, around several μm by an air bearing (not shown) that is arranged at the bottom surface of reticle stages RST, above the upper surface of a reticle base 136 that is a top board section of a second column 134 (to be described later) constituting body BD. On reticle stage RST, reticle R is fixed by, for example, vacuum suction (or electrostatic suction or the like). Reticle stage RST is finely drivable two dimensionally within the XY plane (the X-axis direction, the Y-axis direction and a rotation direction around a Z-axis (θz direction) that is orthogonal the XY plane) that is perpendicular to an optical axis of the illumination optical system (which coincides with an optical axis AX of projection optical system PL) and is also drivable at a designated scanning velocity in the Y-axis direction on reticle base 136, by a reticle stage drive unit 112 including a liner motor or the like.

Herein, in actual, reticle stage RST includes a reticle coarse motion stage that is drivable by a liner motor in a predetermined stroke range in the Y-axis direction on reticle base 136, and a reticle fine motion stage that is finely drivable in the X-axis direction, the Y-axis direction and the θz direction with respect to the reticle coarse motion stage by actuators such as at least three voice coil motors. However, reticle stage RST is shown as a single stage in FIG. 2. Accordingly, also in the following description, reticle stage RST is explained assuming that reticle stage RST is a single stage that can be finely driven in the X-axis direction, the Y-axis direction and the θz direction by reticle stage drive unit 112 as is described above and also can be scanned and driven in the Y-axis direction. As a matter of course, a stage mechanism that does not have a coarse motion stage and a fine motion stage separately may be used as reticle stage RST.

In the case of this embodiment, a mover of the linear motor is attached to the end surfaces on one side and the other side of the X-axis direction (the depth and front of the page surface of FIG. 2) of reticle stage RST respectively, and stators corresponding to these movers respectively are individually supported by a support member (not shown) that is arranged separately from body BD. Therefore, a reaction force acted on the stators of the linear motor when driving reticle stage RST is allowed to transmit (escape) to the floor surface of the clean room via the support members. Incidentally, although reticle stage drive unit 112 includes the linear motor and the actuators such as voice coil motors as is described above, reticle stage drive unit 112 is shown as a simple block in FIG. 2 for the sake of convenience.

Incidentally, in this embodiment, the reaction frame structure that allows the reaction force to escape via the support member arranged separately from body BD is to be employed. However, a vibration attenuation mechanism by a counter mass method that cancels out a reaction force by moving a counter mass according to the law of conservation of momentum by the action of the reaction force of drive force of reticle stage RST may be employed.

The position of reticle stage RST within the XY plane (including a rotation in the θz direction being a rotation direction around the Z-axis) is constantly detected at a resolution of, for example, around 0.5 to 1 nm with a reticle laser interferometer (hereinafter, referred to as a 'reticle interferometer') 13 fixed on reticle base 136, via a movable mirror 15.

Herein, in actual, on the upper surface of reticle stage RST, a pair of Y-axis movable mirrors made up of hollow retroreflectors are fixed at the end portion on one side (+Y side) of the Y-axis direction a predetermined distance spaced apart in the X-axis direction, and an X-axis movable mirror made up of a flat mirror that has a reflection surface orthogonal to the X-axis direction is fixed at the end portion on one side (+X side) of the X-axis direction. Further, a pair of reticle Y interferometers and a reticle X interferometer individually corresponding to these movable mirrors are severally arranged. In this manner, the reticle interferometers and the movable mirrors are respectively arranged in plural. However, in FIG. 2, they are representatively shown as movable mirror 15 and reticle interferometer 13. Incidentally, for example, the end surface of reticle stage RST on the +X side may be polished in order to form a reflection surface (corresponding to the reflection surface of X movable mirror).

Position information (or velocity information) of reticle stage RST is sent to main controller 120 and main controller 120 drives reticle stage RST via reticle stage drive unit 112 based on the position information (or velocity information).

Moreover, in this embodiment, at a position on a −Y side in a mounting area of reticle R on reticle stage RST, a reticle fiducial mark plate (RFM plate) (not shown) is arranged. On the RFM plate, plural types of measurement marks are formed. An RFM plate similar to this embodiment is disclosed in detail in, for example, Kokai (Japanese Unexamined Patent Application Publication) No. 2002-198303 and the corresponding U.S. patent application Publication No. 2001/0041377, and the like. As long as the national laws in designated states (or elected states), to which this international application is applied, permit, the disclosure of the above U.S. patent application Publication is incorporated herein by reference.

Body BD includes a first column 132 that is installed on the floor surface of the clean room and second column 134 that is placed on first column 132.

First column 132 includes three leg sections 137A, 137B and 137C (though leg section 137C in the depth of the page surface of FIG. 2 is omitted) and a barrel platform (which is also called a 'main frame') 138 that is substantially horizontally supported by leg sections 137A to 137C and constitutes a top board of first column 132.

Each of leg sections 137A to 137C includes a support pillar 140 that is installed on the floor surface and a vibration isolation unit 139 that is fixed to the upper portion of support pillar 140. Each vibration isolation unit 139 isolates microvibration from the floor surface at micro G level, so that the microvibration is hardly transmitted to barrel platform 138. A circular opening (not shown) is formed substantially in the center portion of barrel platform 138, and projection optical system PL is inserted in the opening from above. To a barrel of projection optical system PL, a flange FLG is arranged at a position that is slightly closer to the lower end portion from the center in the height direction, and projection optical system PL is supported by barrel platform 138 via flange FLG.

Second column 134 is arranged enclosing projection optical system PL on the upper surface of barrel platform 138, and includes a plurality of legs, for example, three legs 41A, 41B and 41C (though leg 41C in the depth of the page surface of FIG. 2 is omitted) that severally extend in the vertical direction and reticle base 136 that couples the upper end surface of legs 41A to 41C with one another and is substantially horizontally supported by legs 41A to 41C.

As projection optical system PL, a dioptric system that is a both-side telecentric reduction system and made up of a plurality of lens elements having optical axis AX in the Z-axis direction in common is used. As projection optical system PL, a reduction optical system whose projection magnification β is ¼ is used as an example. Therefore, when slit-shaped illumination area IAR on reticle R is illuminated by illumination light IL from illumination unit ILU (the illumination optical system), illumination light IL having passed through reticle R forms a reduced image (partial inverted image) via projection optical system PL of a circuit pattern of reticle R within slit-shaped illumination area IAR on an exposure area IA, which is conjugate with illumination area IAR, on wafer W whose surface is coated with photoresist.

Wafer stage WST includes an XY stage 141 that is freely driven along the upper surface of a stage base SB within the XY two-dimensional plane (including the θz rotation) by a drive system (not shown) such as a linear motor or planar motor, and a wafer table TB that is mounted on XY stage 141.

Stage base SB is also called a platform, and is substantially horizontally supported by a plurality of, for example, three or four vibration isolation units 43 installed on the floor surface in this embodiment. That is, the configuration is employed in which stage base SB is separately arranged from body BD that holds projection optical system PL and the like.

Each vibration isolation unit 43 includes an airmount mechanism that supports stage base SB and a voice coil motor that is highly responsive and can finely drive stage base SB in the gravity direction (vertical direction: the Z-axis direction in FIG. 2). The airmount mechanism includes a part of a support member that supports stage base SB from below, and a housing to which the part of the support member is attached through an opening end portion of the housing via an elastic member (e.g. diaphragm). In this case, an airtight room is formed inside the housing. The airtight room is connected to an electromagnetic regulator via the opening formed at the housing, and the pressure of gas from outside to fill the airtight room, for example, the pressure of air is adjusted by the electromagnetic regulator according to instructions from main controller 120. The airmount mechanism is configured so as to actively follow the vibration of a low frequency up to about 20 Hz by the adjustment of air pressure by the electromagnetic regulator. Further, the airmount mechanism also operates as a passive vibration isolation unit (vibration isolation pad) that absorbs a vibration component of high frequency that a voice coil motor cannot follow. Further, the voice coil motor described above has a mover that is directly attached to stage base SB and a stator that generates a force that drives stage base SB in the gravity direction by electromagnetic interaction generated between the mover and the stator. The voice coil motor can actively follow the vibration of a frequency higher than about 20 Hz. The voice coil motor is controlled by main controller 120.

Wafer table TB is driven in an optical axis AX direction (Z-axis direction) and a tilted direction to the plane (XY plane) orthogonal to the optical axis, that is, a θx direction being a rotation direction around the X-axis and a θy direction being a rotation direction around the Y-axis by a drive system (not shown) that is placed on XY stage 141 and includes an actuator such as a voice coil motor.

On wafer table TB, wafer W is held by vacuum suction (or electrostatic suction) via wafer holder 25.

On wafer table TB, a movable mirror 27 that reflects a laser beam from a wafer laser interferometer (hereinafter, referred to as a 'wafer interferometer') 31 is fixed, and the position of wafer table TB (wafer W) within the XY plane is constantly detected at a resolution of, for example, around 0.5 to 1 nm by wafer interferometer 31 that is supported being suspended from barrel platform 138.

In this case, in actual, a movable mirror having a reflection surface orthogonal to the Y-axis direction serving as a scanning direction on scanning exposure and a movable mirror having a reflection surface orthogonal to the X-axis direction servings as a non-scanning direction are arranged on wafer table TB, and an X laser interferometer for X-axis direction position measurement and a Y laser interferometer for Y-axis direction position measurement are arranged corresponding to the movable mirrors. However, in FIG. 2, they are representatively shown by movable mirror 27 and wafer interferometer 31. Incidentally, for example, an end surface of wafer table TB may be polished in order to form a reflection surface (corresponding to the reflection surface of movable mirror 27). Further, the X laser interferometer and Y laser interferometer are multiaxis interferometers that have a plurality of measurement axes and can measure a rotation (yawing (θz rotation being a rotation around the Z-axis), pitching (θx rotation being a rotation around the X-axis) and rolling (θy rotation being a rotation around the Y-axis) besides the X and Y positions of wafer table TB. Accordingly, in the following description, the positions in directions in five degrees of freedom of X, Y, θz, θy and θx are to be measured by wafer interferometer 31. Further, the multiaxis interferometer irradiates a laser beam to a reflection surface (not shown) installed at body BD on which projection optical system PL is mounted via a reflection surface installed on wafer table TB inclined at 45 degrees, and may detect relative position information related to the optical axis direction (Z-axis direction) of projection optical system PL.

Incidentally, wafer stage drive unit 128 includes a linear motor, or a planar motor, a voice coil motor or the like, but is shown as a simple block in FIG. 2 for the sake of convenience.

A fiducial mark plate FM whose surface is set to the substantially same height as the surface of wafer W is fixed on wafer table TB. Various types of fiducial marks are formed on the surface of fiducial mark plate FM.

Further, a fiducial plane plate 143 that has the upper surface whose flatness degree is set so high is fixed on wafer table TB. The surface of fiducial plane plate 143 is set to the substantially same height as the surface of wafer W, similarly to fiducial mark plate FM.

A slit aperture is formed in a part of fiducial plane plate 143 and the portion other than the slit aperture is made to be a reflection surface on which a reflection film is formed. Inside wafer table TB below the slit aperture, a photoelectric conversion element (not shown) such as a photo multiplier tube (PMT) is placed. A photoelectric conversion signal from the photoelectric conversion element is supplied to main controller 120. Main controller 120 can measure by a slit-scan method aerial images of various types of measurement marks formed on an image plane by projection optical system PL, by positioning the RFM plate within the filed of projection optical system PL, and receiving a photoelectric conversion signal from the photoelectric conversion element while moving wafer table TB in the Y-axis direction or the X-axis direction. In other words, in this embodiment, an aerial image measurement instrument, which is disclosed in Kokai (Japanese Unexamined Patent Application Publication) No. 2002-198303 and the corresponding U.S. Pat. No. 5,448,332, and the like, is configured including the slit aperture formed in fiducial plane plate 143, the photoelectric conversion element within wafer table TB and the like.

Incidentally, the flatness degree of the surface of fiducial mark plate FM is increased by mirror finish or the like, and the portion where the marks are not formed can be used also as the fiducial plane plate.

Position information (or velocity information) of wafer table TB is sent to main controller 120, and main controller 120 controls wafer table TB via wafer stage drive unit 128 based on the position information (or velocity information).

Further, in exposure apparatus main section 10A of this embodiment, a multipoint focal position detection system (hereinafter, referred to as 'multipoint AF system' as needed) by an oblique incident method is arranged that has a light-transmitting system 160a and a light-receiving system 160b, and detects the position in the optical axis AX direction (Z-axis direction) of the surface of wafer W and a tilt with respect to the XY plane of the surface of wafer W. A multipoint AF system similar to the multipoint AF system of this embodiment is disclosed in detail in, for example, Kokai (Japanese Unexamined Patent Application Publication) No. 06-283403 and the like.

When scanning exposure (to be described later) or the like is performed, main controller 120 also controls a two-dimensional tilt (i.e. rotation in the θx and θy directions) of wafer stage WST in addition to movement of wafer stage WST in the Z-axis direction via wafer stage drive unit 128 based on a focus signal from the multipoint AF system (160a, 160b). That is, by controlling movement of wafer stage WST using the multipoint AF system, autofocus (automatic focusing) and auto-leveling that substantially conform the surface of wafer W to an image-forming plane of projection optical system PL within an irradiation area (exposure area IA described previously) of illumination light IL is carried out.

Further, in exposure apparatus main section 10A, an alignment system ALG by an off-axis method that detects alignment marks (positioning marks) on wafer W, the fiducial marks on fiducial mark plate FM and the like is placed on the side surface of the barrel of projection optical system PL. As alignment system ALG, for example, a sensor of an FIA (Field Image Alignment) system by an image processing method is used that irradiates a broad band detection beam that does not expose resist on wafer W to a subject mark, picks up an image of the subject mark and an image of an index (not shown), which are formed on a light-receiving plane by a reflected beam from the subject mark, using an imaging device (CCD or the like), and outputs their imaging signals. Incidentally, alignment system ALG is not limited to the FIA system, and as a matter of course it is possible to use one alignment sensor or alignment sensors in combination as needed that irradiate(s) a coherent detection light to a subject mark, and detect(s) a scattered light or a diffracted light generated from the subject mark, or make(s) two diffracted lights (e.g. the same-order diffracted lights) generated from the subject mark interfere with each other and detect(s) the interfered light.

Referring back to FIG. 1, wafer loader 40 has a Y guide 18 that extends in the Y-axis direction and an X guide 20 that is located above Y guide 18 (on the front side of the page surface of FIG. 1) and extends in the X-axis direction, as transport guides. X guide 20 is arranged in a state of penetrating partition wall 14.

On Y guide 18, a horizontal multijoint type robot (scalar robot) 26 that is driven by a drive unit (not shown) and moves along Y guide 18 is arranged. Further, to X guide 20, a wafer load arm 28 and a wafer unload arm 30 that are driven by a drive unit (not shown) and move along X guide 20 are arranged. Incidentally, an opening through which wafer load arm 28 and wafer unload arm 30 can severally pass is formed in partition wall 14.

Moreover, at a position on a −Y side in the vicinity of a +X side end portion of X guide 20, a turntable (rotation table) 32 is placed and a wafer edge sensor (not shown) is placed in the vicinity of turntable 32.

Besides, within a loader room 12B, a loader controller 34 is arranged that controls the respective sections of wafer loader system 40 and exchanges information on the wafer being transported with a controller on the C/D side (to be described later) via a communication line, that is, performs communication.

Inline I/F section 110 includes a chamber 212 that is placed on a −Y side of chamber 16, an inline delivery section 114 that is placed in the vicinity of an end portion on a +Y side inside chamber 212, a horizontal multijoint type robot 116 that is placed on a −Y side of inline delivery section 114, and the like.

Inline delivery section 114 includes two wafer delivery sections 124A and 124B that are composed of a base and a set of three support pins arranged at predetermined spacing in the X-axis direction.

Incidentally, the configuration of inline delivery section 114 is not limited to the one shown in FIG. 1, and, for example, may be a configuration that has a wafer delivery section on a load side and a wafer delivery section on an unload side that are placed at predetermined spacing in the vertical direction and driven simultaneously in the vertical direction by a drive mechanism (not shown). As each of the wafer delivery sections, a configuration where a plate-shaped member and a set of three support pins fixed on the upper surface of the plate-shaped member are equipped can be employed.

Inside chamber 212, a carrier base 118 is placed as needed, and a buffer carrier 119 used to temporally store wafer W is mounted on carrier base 118.

As is shown in FIG. 1, C/D50 includes two chambers 52 and 54 that are placed adjacent to each other in the Y-axis direction. Inside one of the chambers, chamber 52, an X guide 56 extending in the X-axis direction is placed. On X guide 56, a horizontal multijoint type robot (scalar robot) 58 that is driven by a drive unit (not shown) and moves along X guide 56 is arranged.

Further, at a position on a −Y side of X guide 56 inside chamber 52, carrier bases 60A, 60B and 60C are placed along the X-axis direction. Open carriers (hereinafter, shortly referred to as 'OC' as needed) 24A, 24B and 24C that can house a plurality of wafers are respectively mounted on carrier bases 60A, 60B and 60C. OCs 24A, 24B and 24C are taken out/put in via an entrance (not shown) that is arranged at a sidewall on a −Y side of chamber 52 and can be opened/closed by a door (not shown). OCs 24A, 24B and 24C may be taken out/put in by an operator's hand after being transported by a PGV (Person Guided Vehicle), or may be taken out/put in automatically after being transported by an AGV (Automated Guided Vehicle). As a matter of course, OCs 24A, 24B and 24C may be mounted on carrier bases 60A, 60B and 60C from above using an OHT (Over Head Transfer).

Besides, inside chamber 52, a coating/developing controller 62 that performs overall control of respective constituents of C/D50 is arranged. Coating/developing controller 62 also controls scalar robot 116 and the like within inline I/F section 110, besides a transport system of the wafer and the like within C/D50.

In a boundary portion of chamber 52 with chamber 54, a wafer delivery section 64 is arranged at a position that is slightly closer to a +X side from the center in the X-axis direction. Wafer delivery section 64 includes a base and a set of three support pins fixed on the base.

Inside chamber 54, a Y guide 66 extending in the Y-axis direction is placed on a +Y side of wafer delivery section 64. On Y guide 66, a horizontal multijoint type robot (scalar robot) 68 that is driven by a drive unit (not shown) and moves along Y guide 66 is arranged.

Further, inside chamber 54, a first developing section 70, a second developing section 72 and a bake section 74 are sequentially placed from the left side to the right side on a −X side of Y guide 66. In addition, a first coating section 76, a second coating section 78 and a cooling section 80 are placed on a +X side of Y guide 66 facing first developing section 70, second developing section 72 and bake section 74 respectively.

First coating section 76 and second coating section 78 have a spin coater. The spin coater forms a uniform resist film on a wafer by falling drops of resist on the wafer held horizontally and rotating the wafer. The spin coater includes the combination of a resist supply system, a spin motor and a cup. The revolutions can be set up to several thousands revolutions per minute.

Bake section 74 includes a baking unit. As the baking unit, a resistance heating method, an infrared heating method or the like can be used. In this case, the baking unit performs prebake (PB) and post-exposure bake (PEB). The former is the heat treatment that is implemented to vapor residual solvent in the coated film and enhance adhesion between the coated film and the wafer after resist is coated on the wafer. Since the PB is performed before exposure, the PB is performed with the temperature or under, with which a polymer does not polymerize or thermal decomposition of additive is not generated. Further, the latter is the heat treatment that is performed after exposure before development process to reduce deformation of a resist pattern (resist sidewall shape) due to standing wave effect in the case of performing exposure with a light having a single wavelength. Further, the PEB is also performed for the purpose of catalytic facilitation after exposure of chemically-amplified resist.

Cooling section 80 includes, for example, a cooled flat plate that is called a cooling plate. This plate is cooled down by, for example, circulation of cooling water or the like. Besides, electron cooling by the Peltier effect is used in some cases. In this embodiment, the wafer heated on the PB is cooled down to the temperature that has no influence within exposure apparatus 10.

First developing section 70 and second developing section 72 include a developing unit that develops a wafer on which a pattern image is formed on resist. As the developing unit, any one of a spin method, a dip method, a spray method and the like can be used.

Moreover, at a boundary portion between chamber 54 and chamber 212 on a +Y side of Y guide 66, a wafer delivery section 82 is arranged. Wafer delivery section 82 includes a base and a set of three support pins fixed on the base.

Figure 3:
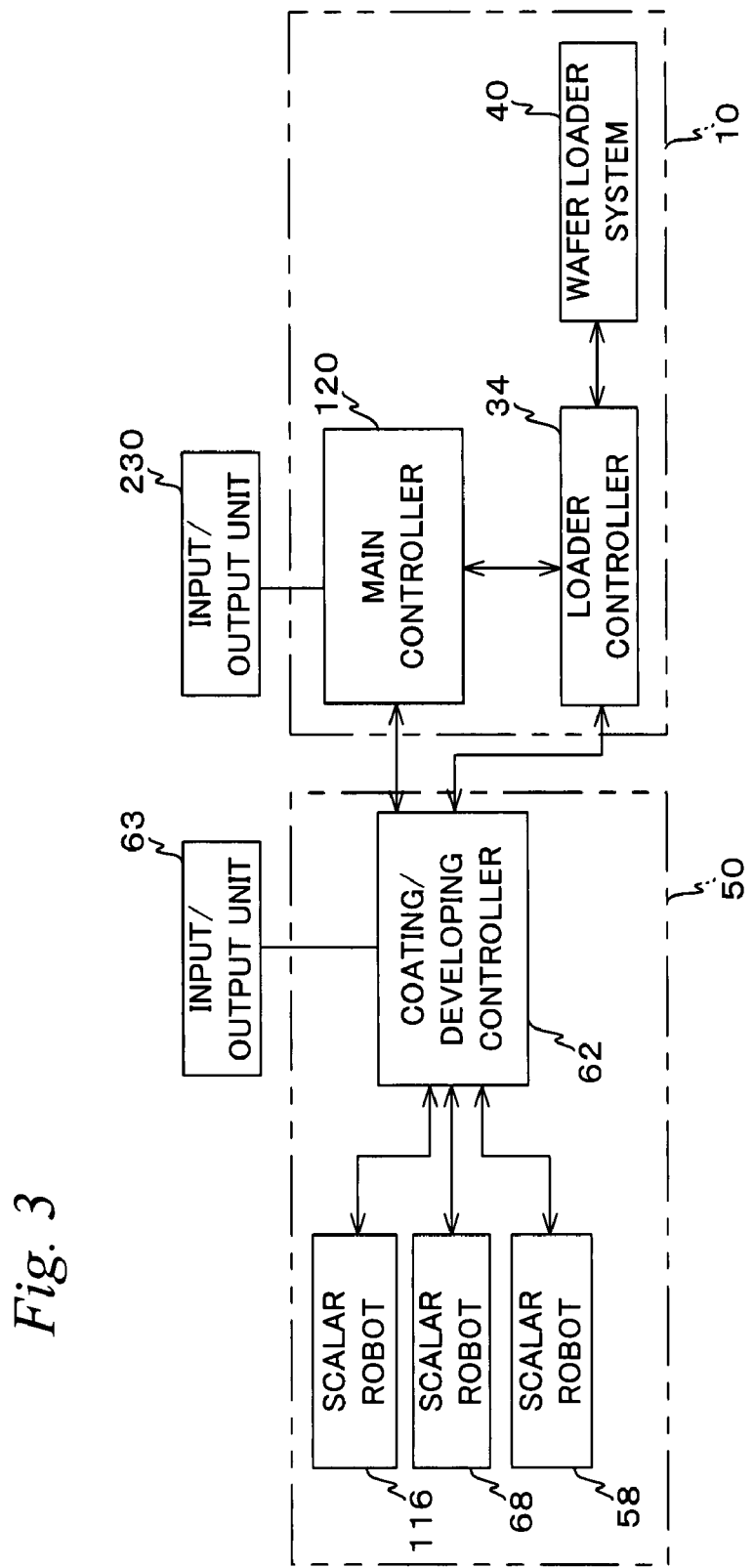
FIG. 3 is a block diagram schematically showing the configuration of a control system of the lithography system in FIG. 1.

FIG. 3 shows the configurations of the control systems of lithography system 100 in a block diagram. As is shown in FIG. 3, the control system on an exposure apparatus 10 side is mainly configured of main controller 120, and loader controller 34 and the like are kept under the control of main controller 120. Main controller 120 is composed of a workstation (or microcomputer) or the like, and an input/output unit 230 that is equipped with a keyboard, a pointing device such as a mouse, and a CRT display or a liquid crystal display, and the like is arranged with main controller 120.

Meanwhile, the control system on a C/D50 side is mainly configured of coating/developing controller 62, and coating/developing controller 62 controls scalar robots 58, 68 and 116, and the like. Further, in this embodiment, scalar robots 58, 68 and 116, Y guide 66, and X guide 56 and the like constitute a substrate transport system on the C/D side. Input/output unit 63 that is similar to input/output unit 230 is connected to also coating/developing controller 62.

In this embodiment, the configuration is employed in which data communication can be made between loader controller 34 on the exposure apparatus 10 side and coating/developing controller 62 on the C/D50 side, and between main controller 120 and coating/developing controller 62, respectively. In this case, information on a wafer being transported is mainly exchanged between loader controller 34 and coating/developing controller 62. Further, various kinds of information (to be described later) is exchanged between main controller 120 and coating/developing controller 62.

Next, the processing operation to a wafer by lithography system 100 will be described.

It is assumed that wafers W of a lot unit (e.g. 25 wafers) are housed in OC 24A, 24B and 24C respectively and OC 24A, 24B and 24C are mounted on carrier bases 60A, 60B and 60C respectively.

In this case, as an example, the case where wafers W within OC 24B are processed will be described. Incidentally, although the operations of respective sections described below are carried out by coating/developing controller 62, loader controller 34 that is under the control of main controller 120, and the like shown in FIG. 3, the description regarding these controllers will be omitted in the following description for the sake of simplification of explanation, except for the case the description is especially needed.

First, scalar robot 58 takes out a first wafer (hereinafter, referred to as a 'wafer $W_1$' for convenience) from the inside of OC 24B, and mounts it on wafer delivery section 64. At this point of time, scalar robot 68 is assumed to have moved to the left end position in FIG. 1. Then, scalar robot 68 transports wafer $W_1$ from wafer delivery section 64 into, for example, first coating section 76. Then, the spin coater within first coating section 76 starts the coating of resist.

In parallel with the operation of scalar robot 68, scalar robot 58 takes out a second wafer (referred to as a 'wafer $W_2$' for convenience) from the inside of OC 24B, and mounts it on wafer delivery section 64. Then, scalar robot 68 transports wafer $W_2$ from wafer delivery section 64 into second coating section 78. When the resist coating of wafer $W_1$ ends, scalar robot 68 takes out wafer $W_1$ from first coating section 76 and transports it into bake section 74. Then, the baking unit within bake section 74 starts heat treatment (PB) of wafer $W_1$.

By the time when wafer $W_1$ is transported into bake section 74, scalar robot 58 takes out a third wafer (referred to as a 'wafer $W_3$' for convenience) from the inside of OC 24B, and mounts it on wafer delivery section 64. Then, scalar robot 68 transports wafer $W_3$ from wafer delivery section 64 into a first coating section 76.

Then, when the PB of wafer $W_1$ ends, scalar robot 68 takes out wafer $W_1$ from bake section 74 and transports it into cooling section 80. Then, the cooling of wafer $W_1$ is started inside cooling section 80. The cooling is performed, using, as its target temperature, the temperature that does not affect the respective sections within exposure room 12A when the wafer is transported inside chamber 16 of exposure apparatus 10, in particular, transported into exposure room 12A, for example, the target temperature of an air-conditioning system within exposure room 12A that is set in the range of 20 to 25 degrees centigrade. Incidentally, since a pattern having a fine line width is transferred and formed on a wafer in the recent exposure apparatuses, the temperature control is an important item. This is because even if expansion/shrink of the wafer due to the temperature change is very slight, that causes various adverse affects such as line width abnormality or overlay defect. However, the target temperature at the cooling time may be set taking into consideration the temperature change that occurs while the wafer is transported to wafer stage WST of the exposure apparatus after the cooling.

Next, scalar robot 68 takes out wafer $W_2$ to which the resist coating ends from second coating section 78 and transports it into bake section 74, and subsequently, transports a fourth wafer (referred to as a 'wafer $W_4$' for convenience), which has already been mounted on wafer delivery section 64 by scalar robot 58 at this point of time, from wafer delivery section 64 into second coating section 78.

Then, when the cooling of wafer $W_1$ ends within cooling section 80, scalar robot 68 mounts wafer $W_1$ on wafer delivery section 82. Subsequently, when the PB of wafer $W_2$ within bake section 74 ends, scalar robot 68 takes out wafer $W_2$ from bake section 74 and transports it into cooling section 80. Next, scalar robot 68 takes out wafer $W_3$ to which the resist coating ends from first coating section 76 and transports it into bake section 74, and then transports a fifth wafer (referred to as a 'wafer $W_5$' for convenience), which has already been mounted on wafer delivery section 64 by scalar robot 58 at this point of time, from wafer delivery section 64 into first coating section 76. After that, a series of resist coating, PB and cooling to wafers similar to the one described above, and the transportation operations of the wafers described above associated with the series of processing are performed sequentially and repeatedly, and wafer W is sequentially mounted on wafer delivery section 82.

Within inline I/F section 110, scalar robot 116 sequentially mounts the wafer before exposure (not exposed), which is sequentially mounted on wafer delivery section 82, on wafer delivery section 124A on a load side of inline delivery section 114.

Meanwhile, on an exposure apparatus 10 side, first, scalar robot 26 moves along Y guide 18 to the left end position, and receives wafer $W_1$ from inline delivery section 114 via the opening of chamber 16. Next, scalar robot 26 moves along Y guide 18 to the right side in FIG. 1 up to the front of turntable 32, and mounts wafer $W_1$ on turntable 32, and immediately after that, scalar robot 26 moves along Y guide 18 to the left end position to receive the next wafer, wafer $W_2$.

Afterward, turntable 32 is driven and rotated by a drive system (not shown), and with this operation, wafer $W_1$ held on turntable 32 is rotated. Detection of the wafer edge is performed by a wafer edge sensor during the rotation of wafer $W_1$, and based on the detection signal, a direction of a notch of wafer $W_1$, and an eccentric amount (direction and magnitude) between the wafer center and the center of turntable 32 are obtained by loader controller 34. Loader controller 34 rotates turntable 32 to make the direction of the notch portion of wafer $W_1$ coincide with a predetermined direction.

At this point of time, load arm 28 is located at a predetermined wafer receiving position and receives wafer $W_1$ on turntable 32. In this case, load arm 28 receives wafer $W_1$, after load arm 28 once moves to the position where an X component of the eccentric amount between the wafer center and the center of turntable 32 obtained beforehand is corrected. After that, load arm 28 starts to move along X guide 20 toward above wafer stage WST that waits at a predetermined loading position.

At this point of time, scalar robot 26 has already received wafer $W_2$, which was mounted on wafer delivery section 124A of inline delivery section 114 by scalar robot 116 before the point of time. Then, when load arm 28 moves away from Y guide 18 a predetermined distance, scalar robot 26 moves along Y guide 18 to the right side up to the front of turntable 32, and mounts wafer $W_2$ on turntable 32. After that, scalar robot 26 moves to a predetermined waiting position, and also the rotation of turntable 32 and wafer edge detection by the wafer edge sensor are started, and then, a direction of a notch of wafer $W_2$ and an eccentric amount (direction and magnitude) between the wafer center and the center of turntable 32 are computed.

When load arm 28 transports wafer $W_1$ to above wafer stage WST, load arm 28 delivers wafer $W_1$ to wafer stage WST. In this case, right before wafer $W_1$ is delivered from load arm 28 to wafer stage WST, wafer stage WST is finely driven in the Y-axis direction so that a Y component of the eccentric amount described above is corrected.

Then, the exposure operation to wafer $W_1$ delivered on wafer stage WST is performed. Incidentally, similar to the conventional scanners, the exposure is performed by repeating an operation for positioning reticle R (reticle stage RST) and wafer $W_1$ (wafer stage WST) with a scanning starting position for exposure of each shot area, and a scanning exposure operation for illuminating a slit-shaped illumination area on reticle R with an illumination light for exposure while synchronously moving reticle R and wafer $W_1$ and sequentially transferring a pattern of reticle R on each shot area on wafer $W_1$ via projection optical system PL.

When the exposure described above ends, wafer stage WST moves to an unloading position, that is, the loading position described previously, and unload arm 30 receives wafer $W_1$ after exposure, transports it to above Y guide 18, and delivers it to scalar robot 26 that is waiting there. Then, scalar robot 26 transports wafer $W_1$, and eventually delivers it to wafer delivery section 124B on the unload side of inline delivery section 114.

In this case, when scalar robot 26 moves to the inline delivery section 114 side up to the position where scalar robot 26 does not interfere with load arm 28, load arm 28 receives wafer $W_2$ to which the rotation adjustment ends from turntable 32, transports the wafer toward above wafer stage WST that is waiting at the loading position and delivers it onto wafer stage WST.

After that, the exposure operation to wafer $W_2$ delivered on wafer stage WST is performed. Afterward, within exposure apparatus 100, the processing is repeatedly performed in which third wafer $W_3$ and the succeeding wafers that are mounted on wafer delivery section 124A are sequentially loaded and transported onto wafer stage WST via the similar route to the one described above, and exposure is performed, and then eventually the wafers are delivered to wafer delivery section 124B on the unload side of inline delivery section 114.

Meanwhile, within inline I/F section 110, as is described previously, after the point of time when exposure to the first wafer $W_1$ ends on the exposure apparatus 10 side and wafer $W_1$ is transported to wafer delivery section 124B by scalar robot 26 on the exposure apparatus 10 side, scalar robot 116 repeatedly performs an operation for transporting wafer W before exposure from wafer delivery section 82 and mounting the wafer on wafer delivery section 124A, and an operation for transporting wafer W after exposure from wafer delivery section 124B and mounting the wafer on to wafer delivery section 82, in a predetermined order.

As is described above, the first wafer $W_1$ after exposure, which has been transported from wafer delivery section 124B and mounted onto wafer delivery section 82 by scalar robot 116 within inline I/F section 110, is transported into bake section 74 by scalar robot 68, and the PEB is performed by the baking unit within bake section 74. A plurality of wafers can be simultaneously housed within bake section 74.

Wafer $W_1$ to which the PEB ends is taken out from bake section 74 by scalar robot 68, and for example, transported into first developing section 70 and development is started by the developing unit within first developing section 70.

During the development, in the case the second wafer $W_2$ after exposure is mounted on wafer delivery section 82, scalar robot 68 transports wafer $W_2$ from wafer delivery section 82 into bake section 74. Then, the PEB is performed by the baking unit within bake section 74. Next, scalar robot 68 performs operations such as an operation for mounting the next wafer onto wafer delivery section 82, or an operation for transporting wafer $W_2$ to which the PEB ends into second developing section 72, in a predetermined order.

Then, when the development to wafer $W_1$ ends, scalar robot 68 takes out wafer $W_1$ from first developing section 70, and mounts it onto wafer delivery section 64. Wafer $W_1$ is eventually transported into a predetermined storage rack within OC 24B by scalar robot 58. Afterward, within C/D50, the PEB, development, and transport of wafer are repeatedly performed to the second and succeeding wafers, in the similar procedure to that for wafer $W_1$.

The forgoing description can be summarized as follows. Until right after exposure of the first wafer ends, the taking-out of wafers from OC 24B, resist coating, PB, cooling and transport of the wafers associated with these operations are repeatedly performed in a predetermined procedure and order by the respective constituents within C/D50 under control of coating/developing controller 62, and scalar robot 116 and the like within inline I/F section 110; and the wafers before exposure are sequentially mounted on wafer delivery section 124A. Further, after right after exposure of the first wafer, the taking-out of wafers from OC 24B, resist coating, PB, cooling and transport operations of the wafers associated with these operations, and the PEB and development to wafers after exposure that are sequentially mounted on wafer delivery section 124B and transport of the wafers into OC 24B, and transport operations associated with these operations are repeatedly performed in a predetermined procedure and order.

In this embodiment, information on wafer transport is exchanged between coating/developing controller 62 and loader controller 34, and coating/developing controller 62 and loader controller 34 control the respective sections of their wafer transport systems based on the information, which allows the foregoing transport (delivery) of each wafer between the C/D50 side and the exposure apparatus 10 side via inline I/F section 110 described above to be performed smoothly.

In the meantime, in order to perform the processing operations of wafers described above smoothly for the long period of time, specific operations necessary for maintaining performance of the apparatuses such as maintenance of the respective constituents of exposure apparatus 10 and C/D50 that constitute lithography system 100 need to be performed. Incidentally, the specific operations herein include all the operations, such as maintenance (including component replacement besides periodic maintenance and other maintenances), and self-calibration, which are necessary for maintaining performance of the apparatuses and that require the stop of the primary operations of the apparatuses.

Next, a specific example of the maintenance and self-calibration performed in exposure apparatus 10 will be described.

a. Laser Gas Exchange in Laser Unit 1

In general, the excimer laser emits a laser light as a nanosecond-order pulse light, when the mixture of three types of gases, such as a halogen gas such as fluorine serving as a medium gas, a rare gas such as krypton or argon, helium or neon serving as a buffer gas is encapsulated in a laser chamber, and a halogen gas (fluorine $F_2$) and a rare gas (such as Kr or Ar) react with each other by glow discharge between discharging electrodes within the laser chamber. In the excimer laser, since a halogen gas binds to impurities generated within the chamber or adsorbs to the inner side of the chamber while laser light emission is repeated, the concentration of the halogen gas is reduced and the pulse energy of the laser is reduced accordingly, and also respective components of the excimer laser light source deteriorate. Further, since ultraviolet light having high light intensity is irradiated, a transmittance window that makes the laser light passes through, a beam splitter (not shown) and the like also deteriorate.

Then, in the case such excimer laser is used as a light source of the exposure apparatus, the fluctuation in pulse energy causes reduction in control accuracy of an exposure dose on a wafer, reduction in performance that decreases interference fringe on a wafer due to an optical system, reduction in the S/N ratio of a signal of a photoelectric detection system of a pulse energy monitor system, and the like. Therefore, in the exposure apparatus that uses the excimer laser as a light source, by monitoring the pulse energy that is reduced according to reduction in the gas concentration, and performing feedback control of the supply voltage of high-voltage power supply (the voltage applied to the discharging electrodes from the high-voltage power supply) based on the monitoring results, the supply voltage is gradually increased and the pulse energy is kept to a constant level. However, the supply voltage that can be applied has the limit, and therefore, when the applied voltage reaches the limit, the pulse energy needs to be kept at a constant level by performing a gas exchange operation to make the gas concentration return to an appropriate value and decreasing the applied voltage accordingly.

Then, because laser unit 1 composed of a KrF excimer laser or an ArF excimer laser is used as a light source also in exposure apparatus 10 of this embodiment, gas exchange is needed. For example, in the case laser unit 1 is an ArF excimer laser, the gas within laser unit 1 needs to be exchanged at the frequency about once per three days. The gas exchange requires around 30 minutes, and during the gas exchange, exposure apparatus 10 cannot perform any of the operations using laser light.

Further, the gas exchange is performed right before exposure to a wafer at the head of a lot is started. This is because deterioration in gas caused by time lapse is prevented and the life of gas is kept effective by making exposure to the wafer be performed right after the gas exchange (in other words, making the gas exchange be performed right before exposure to the wafer). Accordingly, for the lot that is subject to the gas exchange, about 30 minutes longer period time than other lots is required. Incidentally, the gas exchange of an excimer laser light source is disclosed in, for example, Kokai (Japanese Unexamined Patent Application Publication) No. 02-294013 and the corresponding U.S. Pat. No. 5,383,217, and the like. As long as the national laws in designated states (or elected states), to which this international application is applied, permit, the disclosure of the above U.S. Patent is incorporated herein by reference.

b. Bending Measurement of Movable Mirror 27 (to be More Specific, X Movable Mirror and Y Movable Mirror) on Wafer Table TB The position of wafer table TB is measured by the laser interferometers that irradiate a laser beam (measurement beam) perpendicularly to a reflection surface of the X movable mirror and the Y movable mirror and receive a reflected beam from each reflection surface. Each of the laser interferometers measures a change in the position of the movable mirror reflection surface in the measurement axis direction (direction of the measurement beam) using a reference mirror (fixed mirror) (not shown) as a datum. Accordingly, when the reflection surface of the movable mirror has bending, measured position information of the wafer table includes an error corresponding to the bending of the reflection surface.

However, since each movable mirror needs to have a length in the X-axis direction and the Y-axis direction corresponding to a movement stroke of wafer table TB (XY stage 141) and has a considerable length, it is not easy to ensure the flatness degree favorably no matter how highly accurate surface treatment (mirror-finish) is performed. Further, even if a movable mirror having a favorable flatness degree can be manufactured, it is highly probable that distortion occurs when the movable mirror is fixed on wafer table TB or distortion occurs due to temporal change. Further, in the case of taking into consideration overlay accuracy and alignment accuracy that are required according to increased exposure accuracy required for the exposure apparatus, it becomes extremely difficult to manufacture a planar mirror having a flatness level that satisfies the required accuracy. Accordingly, in order to maintain performance of the exposure apparatus, it is indispensable to measure the shapes of the reflection surfaces of the movable mirrors at times and to correct measurement error of the laser interferometers caused by the reflection surface shapes of the movable mirrors using the measurement results.

As the measurement method of a shape of a reflection surface of a movable mirror (movable mirror bending), a method disclosed in, for example, Japanese Patent No. 3295846 and the like can be used, in which local tilts of a movable mirror are measured by an interferometer and a shape of a reflection surface of the movable mirror is obtained by accumulating the tilts. The movable mirror bending measurement by this method requires around 10 minutes.

c. Calibration of Offset Between Sensors of Multipoint AF System (160a, 160b), Flatness (Flatness Degree) Measurement of Wafer Holder 25, and the Like A wafer is sucked and held on a wafer holder by vacuum suction or electrostatic suction. Therefore, the wafer is deformed according to a surface shape of the wafer holder. Accordingly, when the flatness of the wafer holder is defective, the flatness of the surface of the wafer held by suction on the wafer holder becomes defective, which causes exposure defect due to defocus as a consequence. Particularly, in the exposure apparatus that uses an ArF excimer laser light or a KrF excimer laser light as illumination light IL for exposure, and a projection optical system having a large numerical aperture (N.A.) in order to achieve the required resolution, the slight unevenness of the wafer holder that has conventionally not been a problem cannot be ignored.

As the measurement method in which the flatness of the wafer holder is measured, in the exposure apparatus equipped with the multipoint AF system (160a, 160b) as in this embodiment, a method is relatively frequently employed in which surface position information at a plurality of detection points (measurement points) on a measurement wafer (super flat wafer) that is held by suction on the wafer holder and whose flatness degree is set so high is obtained using the multipoint AF system, and the flatness of the super flat wafer (i.e. holder flatness) is computed using the surface position information (position information related to the Z-axis direction).

However, a plurality of sensors in the multipoint AF system (160a, 160b) individually measure surface position information of an object to be measured at a plurality of detection points (measurement points), and therefore, when there is the output variation between the sensors (such as variation caused by individual variability), not only it becomes difficult to accurately measure the holder flatness due to the output variation becoming an error factor, but also the image-forming performance of a pattern is seriously affected by the output variation becoming a factor of control error of focus/leveling of a wafer at the time of exposure.

Then, in this embodiment, calibration of offset between sensors of the multipoint AF system (160a, 160b) is performed, and also the holder flatness measurement described above is to be performed using the multipoint AF system (160a, 1600*b*) after the calibration.

In this case, when performing calibration of offset between sensors of the multipoint AF system (160a, 160b), the calibration of offset between sensors can be performed using fiducial plane plate 143 similarly to a method that is disclosed in, for example, the pamphlet of International Publication No. 02/054462 and the like. Further, as the method of the holder flatness measurement, a method that is disclosed in, for example, Kokai (Japanese Unexamined Patent Application Publication) No. 2002-048527 and the like can be employed. In other words, when measuring the holder flatness, position information (surface position information) related to the Z-axis direction at a plurality of measurement points on the surface of a super flat wafer that is held by suction on wafer holder 25 is measured, using the multipoint AF system (160a, 160b) after the foregoing calibration of offset between sensors. Such measurement is performed at a plurality of points on the super flat wafer while moving wafer stage WST. Then, at the stage where a predetermined number of surface position information set in advance is obtained, predetermined statistical processing is performed to the surface position information group obtained so far, and the flatness degree (flatness) of the super flat wafer is computed as the flatness degree of the wafer holder.

Based on a result of the measurement of wafer flatness described above, foreign particles such as dust existing on the wafer holder can also be detected, and in the case the foreign particles are detected, the cleaning or replacement of the wafer holder is performed. Also in the case the result of the flatness measurement of the wafer holder is defective, the replacement of the wafer holder or the like is performed.

The calibration of offset between sensors of the multipoint AF system (160a, 106b) and the flatness measurement of the wafer holder, and the operations such as the replacement of the wafer holder based on the result of the measurement require around 30 minutes.

Incidentally, when performing the calibration of offset between sensors, a super flat wafer may be used without using fiducial plane plate 143. Such method using the super flat wafer is also disclosed in the pamphlet of International Publication No. 02/054462.

d. Rotation Measurement of Fiducial Mark Formed on Fiducial Mark Plate FM (Stage Orthogonality Measurement)

In the case alignment system ALG by an off-axis method is used, measurement of a position coordinate on a stage coordinate system of a fiducial mark formed on fiducial mark plate FM on wafer table TB is essential, when performing baseline measurement of the alignment system. The measurement of a position coordinate of a fiducial mark on the stage coordinate system is performed on the assumption that a positional relation between movable mirror 27 (X movable mirror, Y movable mirror) on wafer table TB and fiducial mark plate FM has a predetermined relation. And, the position coordinate of the fiducial mark on the stage coordinate system is computed based on a positional relation between a detection center of alignment system ALG and the fiducial mark, and X and Y position coordinates measured by wafer interferometer 31 at the time of the detection, that is, position information on the X movable mirror and the Y movable mirror using a reference mirror as a datum. Accordingly, it is preferable that a relation between fiducial mark plate FM and moveable mirror 27 (X movable mirror, Y movable mirror) is always constant.

However, fiducial mark plate FM rotates with respect to movable mirror 27 (X movable mirror, Y movable mirror) in some cases, because an operator touches movable mirror 27 (X movable mirror, Y movable mirror) or fiducial mark plate FM when performing other maintenance works, or because of temporal change due to thermal influence or the like. When the positional relation between fiducial mark plate FM and movable mirror 27 (X movable mirror, Y movable mirror) fluctuates in this manner, error occurs in measurement of the fiducial mark position and baseline measurement accuracy is lowered, which could lead to deterioration in exposure accuracy. Then, in this embodiment, by detecting the fiducial mark on fiducial mark plate FM using alignment system ALG, how the positional relation between the movable mirror and the fiducial mark deviates from the initial state is measured and correction of the initial value is performed.

Incidentally, the foregoing rotation measurement of the fiducial mark requires around 5 to 10 minutes.

e. Confirmation of Synchronous Accuracy Between Reticle Stage RST and Wafer Stage WST In the scanning exposure apparatus by a step-and-scan method as in this embodiment, a dynamic factor that is synchronous error between reticle stage RST (reticle) and wafer stage WST (wafer) at the time of scanning exposure becomes a factor that causes position deviation (or distortion) of an image of a pattern transferred on a wafer or deterioration in resolution. Further, it is known that the synchronous accuracy between reticle stage RST (reticle) and wafer stage WST (wafer) changes over time, and there is a possibility that exposure accuracy is lowered according to time lapse.

Thus, in this embodiment, reticle stage RST and wafer stage WST are synchronously moved, for example, in accordance with shot map, and measurement results during the synchronous movement of interferometer 13 that measures the position of reticle stage RST and of interferometer 31 that measures the position of wafer stage WST are obtained. Then, the judgment is made of whether or not synchronous error occurs between the measurement result of interferometer 13 on the reticle side and the remeasurement result of interferometer 31 on the wafer side. Such measurement of synchronous error is described in, for example, Kokai (Japanese Unexamined Patent Application Publication) No. 11-067665 and the like.

Incidentally, the foregoing measurement of synchronous accuracy requires around 15 minutes.

f. Repeatability Measurement of Wafer Loading

In the case wafer W is not always loaded an a desired position when wafer W is loaded on wafer table TB, even if alignment marks (search marks or fine marks) on wafer W are attempt to be measured using alignment system ALG, for example, on wafer alignment, the situation occurs where the alignments marks are not located in a measurement area (field) of the alignment system. In such a case, the operator or the like has to assist, which could be a factor that causes reduction in throughput.

Accordingly, repeatability measurement of wafer loading is important, and in this embodiment, repeatability of wafer loading is measured by sending a predetermined number of wafers from the C/D side to the exposure apparatus side and sequentially executing loading and unloading of the wafers. Or, repeatability of wafer loading is measured by repeatedly executing loading and unlading of one wafer. When the repeatability is lowered in the measurements, correction of transport sequence or the like needs to be performed.

The forgoing repeatability measurement of wafer loading normally requires around 15 to 30 minutes, though the required period of time is dependent on the number of wafers used for the measurement or the repetition number of the measurement.

g. Plane Conformity of AF Plane and Wafer Table Upper Surface

Herein, an AF plane means a virtual datum plane that is defined in the case when all the outputs of a plurality of sensors of the multipoint AF system (160a, 160b) in which the offset between sensors described above has been adjusted have a datum value (e.g. zero).

When performing focus/leveling control during exposure, in the case the surface of a wafer on a wafer table and an image plane of projection optical system PL are away from each other, it takes time to conform the surface position of the wafer to the image plane or the delay in conforming the surface position of the wafer to the image plane occurs at the time of the focus/leveling control, which leads to reduction in throughput or exposure accuracy. Accordingly, the wafer surface is desirably located in the vicinity of the image plane of projection optical system PL when performing exposure.

Thus, in this embodiment, plane conformity of the AF plane and the wafer table upper surface, that is, adjustment for making the AF plane and a moving surface (travel surface) of a wafer stage parallel to each other is to be carried out as follows.

More specifically, in exposure apparatus 10 of this embodiment, wafer stage WST is supported on stage base SB that is separately installed from first column 132 by which projection optical system PL is held (refer to FIG. 2). Stage base SB is supported by vibration isolation unit 43.

In this case, the position in a height direction (the optical axis direction of projection optical system PL) of wafer stage WST can be roughly adjusted by adjusting an air amount within the airmount mechanism constituting isolation vibration unit 43 to adjust the height position of stage base SB. Further, the surface position of fiducial plane plate 143 on wafer table TB is substantially coplanar with the surface position of a wafer when being held on wafer holder 25.

Meanwhile, each sensor of the multipoint AF system (160a, 106b) is calibrated in advance so that the best focus position, which is measured in the manner to be described later using, for example, an aerial image measurement instrument, becomes the origin. As a consequence, the AF plane described above is substantially in conformity to the image plane of projection optical system PL.

Accordingly, in this embodiment, by measuring surface position information of fiducial plane plate 143 using the multipoint AF system (160a, 160b), and adjusting the height position of stage base SB via vibration isolation unit 43 based on the measurement result, adjustment for conforming the surface position of fiducial plane plate 143 to the AF plane, that is, making the AF plane and the moving surface (travel surface) of the wafer stage be parallel to each other is carried out.

The forgoing plane conformity requires around 5 minutes.

h. Measurement of Image-Forming Characteristics of Projection Optical System PL and the Like Since image-forming characteristics of projection optical system PL greatly affect transfer accuracy of patterns, the image-forming characteristics need to be measured frequently and adjusted using an image-forming adjustment mechanism (not shown) such as a mechanism that drives a plurality of specific lens elements constituting projection optical system PL. Further, the measurement result of the best focus position of projection optical system PL is also used for adjustment of an origin position of each sensor of the multi-point AF system (160a, 160b).

Thus, in this embodiment, the best focus position, distortion, comma and the like of projection optical system PL are measured at predetermined timing by measuring aerial images of various measurement marks on the RFM plate described previously by a slit-scan method using the aerial image measurement instrument described above, in the method similar to a method that is disclosed in Kokai (Japanese Unexamined Patent Application Publication) No. 2002-198303 and the corresponding U.S. patent application Publication No. 2001/0041377, and the like. These measurements require around 3 to 4 minutes. Incidentally, not only the best focus position, distortion, comma and the like, but also wavefront aberration may be measured. An apparatus that measures wavefront aberration is disclosed in, for example, the pamphlet of International Publication No. 99/60361 and the corresponding U.S. patent application Ser. No. 09/714,183. As long as the national laws in designated states (or elected states), to which this international application is applied, permit, the disclosures of the above U.S. patent application Publication and the above U.S. patent application are incorporated herein by reference.

i. Periodic Replacement Operation of Components within Exposure Apparatus

Of components of exposure apparatus 10, there exist components that have a life and require periodic replacement, such as a halogen lamp serving as a light source of alignment system ALG, a chemical filter arranged in chamber 16 or the like of exposure apparatus 10, consumable supplies (laser consumable supplies) constituting laser unit 1, and optical components within illumination unit ILU.

For example, the halogen lamp needs to be replaced in a period of around one and half months. Further, the chemical filter needs to be replaced in a period of around 3 to 6 months, and the laser consumable supplies and optical components need to be exchanged in a period of around one year. On the other hand, it is known that the component whose replacement period is longer requires a longer period of time for one replacement, that is, longer downtime of the exposure apparatus at the time of replacement. However, since the life of the components except for the halogen lamp changes depending on the installation environment and usage of the exposure apparatus, the life cannot be defined flatly.

Thus, in this embodiment, the environment and usage of the exposure apparatus are monitored within the exposure apparatus, and the usage and the like are managed by main controller 120. Then, at the stage where the appropriate replacement timing comes, the operator is notified that the replacement timing comes, by displaying the replacement timing on the display of input/output unit 230.

Meanwhile, there exist various maintenance items also on the C/D side, similar to exposure apparatus 10.

For example, first coating section 76 and second coating section 78 within C/D50 have a spin coater and the spin coater includes a rotation drive mechanism that rotates a wafer at high speed while holding the wafer horizontally, and performs a treatment for making a centrifugal force act on treatment liquid such as resist supplied to the wafer and coating and spreading out the treatment liquid on the entire surface of the wafer. At the time of the rotation coating, surplus treatment liquid of the treatment liquid supplied to the wafer spatters outward of the wafer. Therefore, a hollow cup enclosing the periphery of the wafer is arranged to prevent the treatment liquid from spattering outward.

In this manner, the treatment liquid that has spattered at the time of rotation coating adheres to the inner wall of the cup that prevents the treatment liquid from spattering outward. Therefore, when the adherent treatment liquid is dried out and becomes solidified, it falls away from the inner wall of the cup due to vibration or impact and adheres to the surface of the wafer, which causes defective treatment or contamination of the wafer. Further, when layers of solidified treatment liquid are formed on the inner wall of the cup, the surface shape becomes uneven, which disturbs airflow within the cup at the time of rotation treatment. And, there is a possibility that the disturbance of airflow affects a coated film at the outer periphery of the wafer and causes film thickness irregularity of the coated film.

Accordingly, at present, various cleaning methods for cleaning the inner wall of the cup have been proposed. For example, in Kokai (Japanese Unexamined Patent Application Publication) No. 05-082435 and the corresponding U.S. Pat. No. 5,312,487, a coating unit that is equipped with a cup cleaning mechanism is disclosed.

In this embodiment, one of the cleaning methods that have been proposed heretofore is to be performed.

Further, in this embodiment, for example, at the stage where resist coating to a predetermined number of wafers (e.g. 500 wafers) has been performed, the cup cleaning described above is to be performed. Incidentally, this cup cleaning requires around 10 minutes.

Further, there exist the components that need to be periodically replaced also on the C/D50 side, similar to the exposure apparatus 10 side. For example, various filters, pipes and the like are conceivable (e.g. refer to Kokai (Japanese Unexamined Patent Application Publication) No. 11-040490 and Kokai (Japanese Unexamined Patent Application Publication) No. 11-156132 (the corresponding U.S. Pat. No. 6,287,023)). Thus, also in C/D50, coating/developing controller 62 monitors the usage of the respective sections, and at the stage where the appropriate replacement timing of each component comes, notifies the operator that the replacement timing of each component comes by displaying the replacement timing on the display of input/output unit 63.

Further, in this embodiment, information on maintenance on the C/D50 side described above, for example, information on cup cleaning (timing and required period of time), information on timing of component replacement, a period of time required for component replacement and the like are managed by coating/developing controller 62, and the information is sent to main controller 120.

Accordingly, main controller 120 of exposure apparatus 10 receives the information on maintenance on the C/D50 side from coating/developing controller 62 and decides the operations of the apparatus (exposure apparatus 10). In this case, in accordance with specific contents of the information on maintenance, main controller 120 of exposure apparatus 10 performs maintenance work (e.g. at least one specific operation such as the operations of a. to i. described previously) of the apparatus (exposure apparatus 10) concertedly with maintenance work of C/D50. Specifically, main controller 120 decides at least one work of the apparatus that can be carried out in parallel with the maintenance work on the C/D50 side among the specific operations such as the operations of a. to i. described previously, taking into consideration contents of the maintenance work in C/D50, the starting timing of the work, the period of time required for the work and the like, and optimizes the maintenance timing. Thus, downtime of exposure apparatus 10 (which is also downtime of C/D50) necessary for performing the specific operation can be decreased as a whole, which makes it possible to improve the operating rate without reducing apparatus performance of exposure apparatus 10 that is inline connected to C/D50.

In particular, since main controller 120 comprehensively manages the information on component replacement on the apparatus side and C/D50 side, it becomes possible to coincide (synchronize) their replacement timing. Thus, for example, the situations can be avoided such as the situation where component replacement on the C/D50 side is performed on a certain day, component replacement on the exposure apparatus 10 side is performed the next day, and the primary operation of exposure apparatus 10 is stopped as many as twice within two consecutive days. Also, by carrying out the component replacement operation on the exposure apparatus 10 side in parallel with the component replacement operation on the C/D50 side, downtime of exposure apparatus and C/D50, that is, downtime of entire lithography system 100 can obviously be reduced.

Incidentally, the maintenance work that is individually performed in exposure apparatus 10 and C/D50 has been described so far, as the maintenance work. However, of maintenance items of lithography system 100, maintenance items that cannot be performed without using both exposure apparatus 10 and C/D50 exist. As a specific example of such maintenance items, various measurement methods making use of a printing method can be cited. In such various measurement methods, exposure apparatus 10 transfers one or a plurality of arbitrary measurement pattern(s) to a plurality of areas on wafer W, C/D50 develops wafer W on which the measurement pattern(s) is/are transferred, and after the development, a line width, intervals and the like of a resist image formed on wafer W are measured using an SEM (Scanning Electron Microscope) or alignment detection system ALG, and then performance of each section of exposure apparatus 10 is obtained based on the measurement results. As this type of measurement methods, for example, a measurement method of various image-forming characteristics (including the best focus position) of projection optical system PL is representatively cited.

In this embodiment, main controller 120 of exposure apparatus 10 retains information on maintenance for which one apparatus requires the other apparatus, for example, information on various measurement methods that makes use of the above printing method, information on maintenance that can be individually performed by each apparatus, maintenance information in a. to h. described previously, information on cup cleaning on the C/D side, information on component replacement and the like. And, main controller 120 optimizes the maintenance timing of each apparatus based on these pieces of information. With this constitution, downtime of entire lithography system 100 is reduced.

As is described so far, according to exposure apparatus 10 related to this embodiment, based on information on maintenance from C/D50, main controller 120 can decide to perform a specific operation, which is necessary for maintaining performance of the apparatus and requires the stop of the primary operation of the apparatus, during maintenance of C/D50 (i.e. when the primary operation of the exposure apparatus also needs to be stopped by necessity), in parallel with the maintenance of C/D50. As a consequence, downtime of the exposure apparatus (which is also downtime of C/D50) necessary for performing the specific operation can be reduced as a whole, which makes it possible to improve the operating rate without lowering apparatus performance of the exposure apparatus that is inline connected to C/D50.

Further, according to lithography system 100 related to this embodiment, main controller 120 of exposure apparatus 10 also serves as a maintenance management unit that performs concertedly maintenance work of the exposure apparatus and maintenance work of C/D50. Therefore, unlike the case where maintenance work of the exposure apparatus and maintenance work of C/D50 are performed independently, main controller 120 can optimize the maintenance timing so that maintenance work of both apparatuses is performed simultaneously in parallel wherever possible, which makes it possible to improve the operating rate without lowering performance of lithography system 100.

Incidentally, in the embodiment above, the maintenance work of the exposure apparatus is decided based on the maintenance information of C/D50. However, the present invention is not limited to this, and downtime can be shortened likewise, by making decision of any operation of the exposure apparatus based on the maintenance information of C/D50.

Second Embodiment

Next, a second embodiment of the present invention will be described based on FIG. 4. Herein, with regard to the same or equivalent constituents as/to those of the first embodiment, the same reference codes will be used and the description will be omitted. A lithography system of the second embodiment is different from the first embodiment only in the configuration of a control system, and therefore the different point will be mainly explained in the following description.

Figure 4:
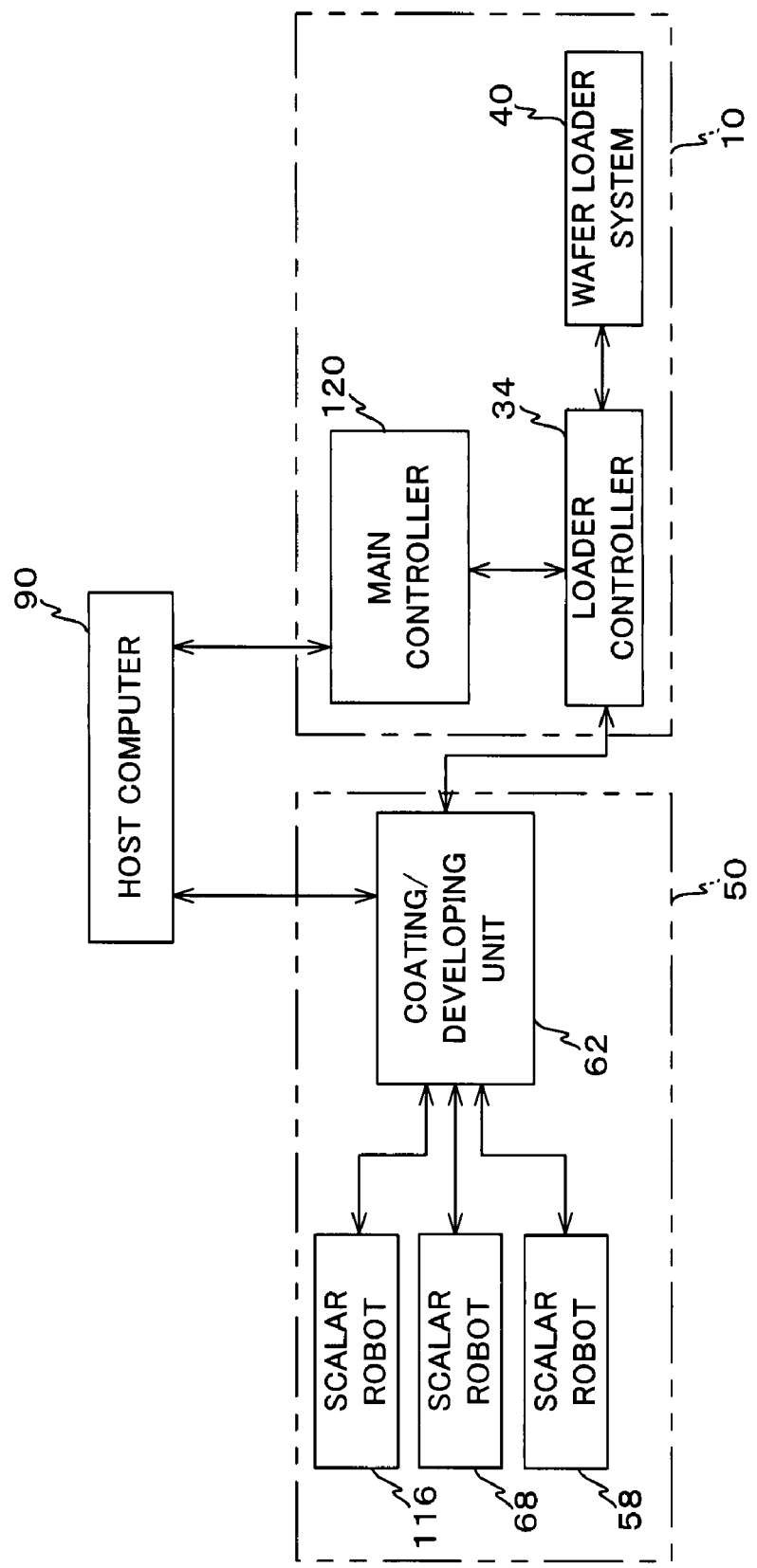
FIG. 4 is a block diagram schematically showing the configuration of a control system of a lithography system related to a second embodiment.

FIG. 4 shows the configuration of a control system of the lithography system of the second embodiment in a block diagram.

As is shown in FIG. 4, the second embodiment has the characteristics that a host computer 90 is connected in common to coating/developing controller 62 on the C/D50 side and to main controller 120 of exposure apparatus 10. As a matter of course, also in the second embodiment, maintenance work items (including component replacement and the like) to be carried out in C/D50 and maintenance work items (including component replacement and various types of self-calibration) to be carried out in exposure apparatus 10 are similar to those in the first embodiment.

In the lithography system of the second embodiment, information (such as contents of maintenance work, timing, and a required period of time) on various types of maintenance (including component replacement) described previously on the exposure apparatus 10 side that is managed by main controller 120 is constantly sent to host computer 90. Further, information (such as contents of maintenance work, timing, and a required period of time) on maintenance (including component replacement) on the C/D50 side that is managed by coating/developing controller 62 is constantly sent to host computer 90.

Then, host computer 90 comprehensively manages necessity of maintenance on the exposure apparatus 10 side and the C/D 50 side, or the like, and concertedly performs maintenance work on the C/D 50 side and maintenance work on the exposure apparatus 10 side.

Further, in the second embodiment, host computer 90 classifies maintenance items into the maintenance items that are performed using exposure apparatus 10 and C/D50 and the maintenance items that are individually performed by each apparatus described above, and performs management so that the maintenance items that are individually performed by each apparatus are performed in parallel in both apparatuses wherever possible.

As is described above, according to the lithography system of the second embodiment, host computer 90 concertedly performs maintenance work of exposure apparatus 10 and maintenance work of C/D50 that is inline connected to exposure apparatus 10. Therefore, unlike the case where maintenance work of exposure apparatus 10 and maintenance work of C/D50 are independently performed, host computer 90 optimizes the maintenance timing so that maintenance work of both apparatuses is performed simultaneously in parallel wherever possible, which makes it possible to improve the operating rate without lowering performance of the lithography system.

Further, host computer 90 classifies maintenance into the maintenance that requires both of exposure apparatus 10 and C/D50 and the maintenance that can be individually performed by each apparatus, and performs the maintenance at the optimal timing (i.e. in the case of the individually-performed maintenance, different maintenance is carried out by respective apparatuses in parallel), which makes it possible to improve the operating rate by shortening downtime of the entire lithography system as much as possible.

Incidentally, in the second embodiment above, the case has been described where main controller 120 of exposure apparatus 10 and coating/developing controller 62 of C/D50 send host computer 90 contents of maintenance work and a required period of time in addition to the timing of the maintenance work. However, the present invention is not limited to this, and when information on required period of time for each maintenance work is stored in a memory within host computer 90, main controller 120 and coating/developing controller 62 may send only information on timing of the maintenance work and contents of the maintenance work to host computer 90.

Incidentally, in the second embodiment above, the maintenance of exposure apparatus 10 and the maintenance of C/D50 are performed concertedly. However, the present invention is not limited to this, and any operation that is necessary for maintaining performance on the exposure apparatus 10 side and requires the apparatus stop may be performed concertedly with the maintenance work of C/D50.

Further, in the second embodiment above, exposure apparatus 10 (main controller 120) and C/D50 (coating/developing controller 62), and host computer 90 send/receive the information via a communication line. Information may be exchanged using a wired line such as a parallel communication line and a serial communication line, as a matter of course, or a wireless line, an infrared line or other lines, as the communication line. Further, for example, in the case parallel communication is performed, an idle line of existing signal lines may be used. In the case serial communication is performed, the information described above only has to be added to a signal (or information) that has been exchanged before.

Incidentally, in each of the embodiments above, the case has been described where C/D50 and exposure apparatus 10 are inline connected via inline I/F section 110. However, the present invention is not limited to this, and the substrate processing apparatus and the exposure apparatus may be directly connected. Further, in each of the embodiments above, the case has been described where the substrate processing apparatus is the C/D that is inline connected to the exposure apparatus. However, the present invention is not limited to this, and the substrate processing apparatus may be any one of, or both of a developing unit (developer) and a resist coating unit (coater), or may be other substrate processing apparatuses, as far as the substrate processing apparatus is inline connected to the exposure apparatus.

Incidentally, in the embodiments above, although the maintenance work (operation) and the calibration work (operation) of exposure apparatus 10 are carried out in parallel with at least a part of the maintenance work (operation) of C/D50, they may be carried out in parallel with at least a part of the maintenance work (operation) and the calibration work (operation) of another apparatus that is connected to exposure apparatus 10.

For example, in laser unit 1 that is connected to exposure apparatus 10, not only the gas exchange as described above but also replacement of optical components and electric components such as discharging electrodes need to be performed, as is disclosed in, for example, Kokai (Japanese Unexamined Patent Application Publication) No. 10-275951 and the corresponding U.S. Pat. No. 6,219,367 and the like. Therefore, in parallel with at least a part of the maintenance work (operations), at least one work (operation) that does not use laser light from laser unit 1 among the work (operations) such as the operations of a. to i. described previously can be carried out in exposure apparatus 10.

Incidentally, in each of the embodiments above, the case has been described where the present invention is applied to the single-stage type projection exposure apparatus by a step-and-scan method. However, the present invention is not limited to this, and can also be applied to a twin-stage type projection exposure apparatus by a step-and-scan method as a matter of course, and to other exposure apparatuses such as a step-and-repeat type projection exposure apparatus or an exposure apparatus by a proximity method. Further, the present invention can also be applied to the exposure apparatus that uses a liquid immersion method as disclosed in the pamphlet of International Publication No. 99/49504.

Further, the usage of the exposure apparatus is not limited to manufacturing semiconductor devices, but the exposure apparatus may be an exposure apparatus used for manufacturing liquid crystal displays that transfers a liquid crystal display device pattern onto a rectangular-shaped glass plate, or an exposure apparatus used for manufacturing display units such as plasma display or organic EL, or thin film magnetic heads, imaging devices (such as a CCDs), micromachines, DNA chips or the like. Further, the exposure apparatus may be an exposure apparatus that transfers a circuit pattern onto a glass substrate, a silicon wafer or the like not only for manufacturing microdevices such as semiconductor devices, but also for manufacturing a reticle or a mask used in an optical exposure apparatus, an EUV exposure apparatus, an X-ray exposure apparatus, an electron beam exposure apparatus or the like.

<<Device Manufacturing Method>>

Next, an embodiment of a device manufacturing method in which the lithography system related to each of the embodiments above is used in a lithography process will be described.

Figure 5:
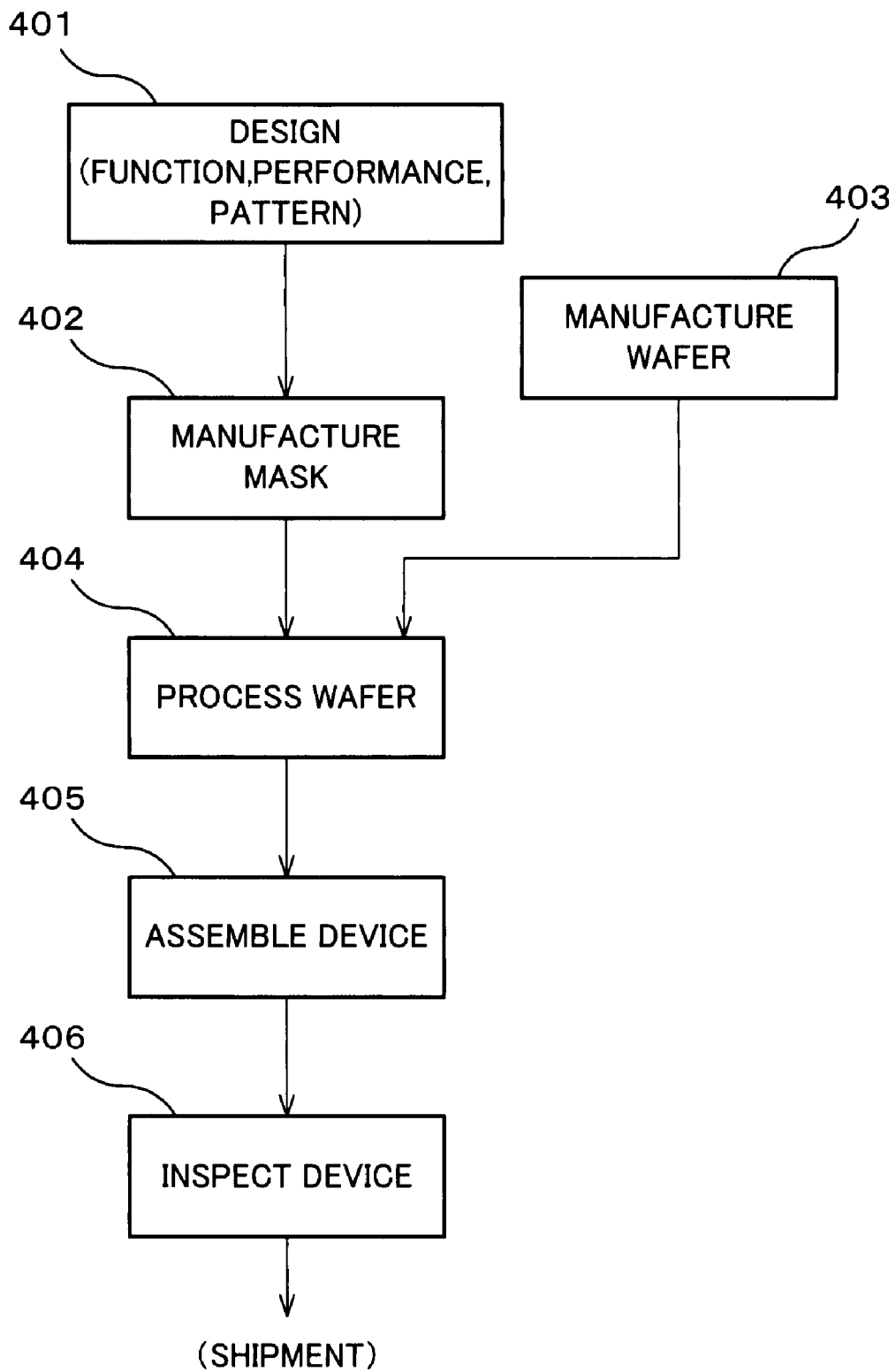
FIG. 5 is a flowchart used to explain an embodiment of a device manufacturing method related to the present invention.

FIG. 5 shows a flowchart of an example when manufacturing a device (a semiconductor chip such as an IC or an LSI, a liquid crystal panel, a CCD, a thin film magnetic head, a micromachine, and the like). As is shown in FIG. 5, first of all, in step 401 (design step), function and performance design of device (such as circuit design of semiconductor device) is performed, and pattern design to realize the function is performed. Then, in step 402 (mask manufacturing step), a mask on which the designed circuit pattern is formed is manufactured. Meanwhile, in step 403 (wafer manufacturing step), a wafer is manufactured using materials such as silicon.

Next, in step 404 (wafer processing step), the actual circuit and the like are formed on the wafer by lithography or the like in a manner that will be described later, using the mask and the wafer prepared in steps 401 to 403. Then, in step 405 (device assembly step), device assembly is performed using the wafer processed in step 404. Step 405 includes processes such as the dicing process, the bonding process, and the packaging process (chip encapsulation), when necessary.

Finally, in step 406 (inspection step), tests on operation, durability, and the like are performed on the devices made in step 405. After these steps, the devices are completed and shipped out.

Figure 6:
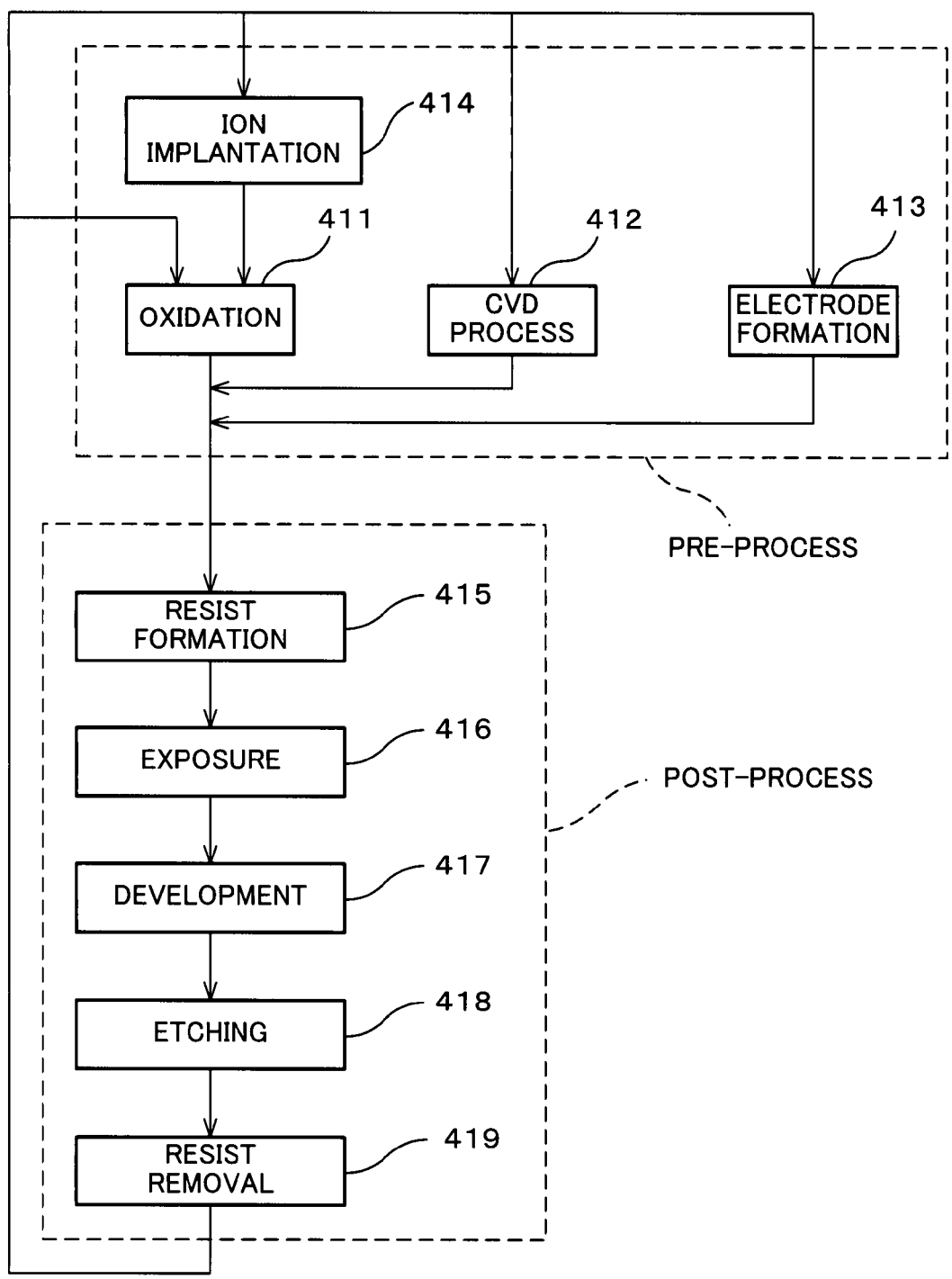
FIG. 6 is a flowchart showing processing in step 404 in FIG. 5.

FIG. 6 is a flowchart showing a detailed example of step 404 described above. In FIG. 6, in step 411 (oxidation step), the surface of wafer is oxidized. In step 412 (CDV step), an insulating film is formed on the wafer surface. In step 413 (electrode formation step), an electrode is formed on the wafer by deposition. In step 414 (ion implantation step), ions are implanted into the wafer. Each of the above steps 411 to 414 constitutes the pre-process in each step of wafer processing, and the necessary processing is chosen and is executed at each stage.

When the above-described pre-process ends in each stage of wafer processing, post-process is executed as follows. In the post-process, first in step 415 (resist formation step), a photosensitive agent is coated on the wafer. Then, in step 416 (exposure step), the circuit pattern of the mask is transferred onto the wafer. Next, in step 417 (development step), the wafer that has been exposed is developed. The processing of steps 415 to 417 is performed by the lithography system in each of the embodiments above.

Then, in step 418 (etching step), an exposed member of an area other than the area where resist remains is removed by etching. Then, in step 419 (resist removing step), when etching is completed, the resist that is no longer necessary is removed.

By repeatedly performing the pre-process and the post-process, multiple circuit patterns are formed on the wafer.

According to the device manufacturing method of the embodiment described above, in the processing process (lithography process) of steps 415 to 417, the lithography system of each of the embodiments above is used, information on maintenance is exchanged between exposure apparatus 10 and C/D50, and downtime is shortened, and therefore the productivity of devices can be improved. In particular, in the case a vacuum ultraviolet light source such as an $F_2$ laser light source is used as a light source for exposure, the productivity of devices can be improved even if the devices have a minimum line width of, for example, around 0.1 μm, coupled with improvement of the resolution of projection optical system PL.

INDUSTRIAL APPLICABILITY

As is described so far, the exposure apparatus, the operation decision method, the substrate processing system and the maintenance management method, and the device manufacturing method are suitable for production of microdevices.

What is claimed is:

1. An exposure apparatus that is inline connected to a substrate processing apparatus, the exposure apparatus comprising:

an operation decision unit that stops a primary operation of the exposure apparatus and causes maintenance to be performed concertedly on both the exposure apparatus and the substrate processing apparatus while the primary operation is stopped, based on information on maintenance provided to the operation decision unit from the substrate processing apparatus and information on maintenance provided to the operation decision unit from the exposure apparatus.

2. The exposure apparatus of claim 1 wherein
the information on maintenance from the substrate processing apparatus includes information on contents of maintenance work to be performed in the substrate processing apparatus.

3. The exposure apparatus of claim 1 wherein
the information on maintenance from the substrate processing apparatus includes information on a period of time required for maintenance work to be performed in the substrate processing apparatus.

4. The exposure apparatus of claim 1, wherein
the maintenance on the exposure apparatus includes maintenance work of a laser unit that is a light source for exposure.

5. The exposure apparatus of claim 1, wherein
the maintenance on the exposure apparatus includes work that does not involve exposure of a substrate.

6. The exposure apparatus of claim 1, wherein
the maintenance on the exposure apparatus includes component replacement work.

7. The exposure apparatus of claim 1, wherein
the primary operation is part of a lithography process in which a device pattern is formed on a substrate using the exposure apparatus.

8. The exposure apparatus of claim 1, wherein the operation decision unit stops the primary operation of the exposure apparatus and causes maintenance to be performed concertedly on both the exposure apparatus and the substrate processing operation while the primary operation is stopped to thereby optimize maintenance timing of both the exposure apparatus and the substrate processing apparatus and reduce downtime of the exposure apparatus.

9. A substrate processing system that comprises an exposure apparatus and a substrate processing apparatus that is inline connected to the exposure apparatus, the system comprising:

a maintenance management unit that stops a primary operation of the exposure apparatus and causes maintenance work to be concertedly performed on both exposure apparatus and the substrate processing apparatus based on maintenance information on the exposure apparatus and maintenance information on the substrate processing apparatus provided to the maintenance management unit.

10. The substrate processing system of claim 9 wherein
the maintenance management unit is one of a control computer equipped in the exposure apparatus and a control computer equipped in the substrate processing apparatus.

11. The substrate processing system of claim 9 wherein
the maintenance management unit is a computer that is connected in common to the exposure apparatus and the substrate processing apparatus.

12. The substrate processing system of claim 9 wherein
the exposure apparatus has a laser unit as an exposure light source, and
the maintenance work on the exposure apparatus includes maintenance work of the laser unit.

13. The substrate processing system of claim 9 wherein
the maintenance work includes component replacement work.

14. The substrate processing system of claim 9, wherein the maintenance management unit retains information on component replacement timing of the exposure apparatus and information on component replacement timing of the substrate processing apparatus, and optimizes the timing of component replacement of the exposure apparatus and the substrate processing apparatus based on the retained information.

15. The substrate processing system of claim 9, wherein the maintenance management unit retains information on maintenance for which one of the exposure apparatus and the substrate processing apparatus requires the other of the exposure apparatus and the substrate processing apparatus and information on maintenance that can be individually performed by each of the exposure apparatus and the substrate processing apparatus, and optimizes maintenance timing of each of the exposure apparatus and the substrate processing apparatus based on the retained information.

16. The substrate processing system of claim 9, wherein the primary operation is part of a lithography process in which a device pattern is formed on a substrate using the exposure apparatus.

17. The substrate processing system of claim 9, wherein the maintenance management unit stops the primary operation of the exposure apparatus and causes maintenance work to be concertedly performed on both the exposure apparatus and the substrate processing apparatus to thereby optimize maintenance timing of both the exposure apparatus and the substrate processing apparatus and reduce downtime of the exposure apparatus.

18. A maintenance management method for substrate processing system that comprises an exposure apparatus and a substrate processing apparatus inline connected to the exposure apparatus, the method including:

a process of obtaining information on maintenance of the exposure apparatus;

a process of obtaining information on maintenance of the substrate processing apparatus; and a process of, based on the obtained information on maintenance of the exposure apparatus and the obtained information on maintenance of the substrate processing apparatus, stopping a primary operation of the exposure apparatus and performing management by a computer so that maintenance work in both of the exposure apparatus and the substrate processing apparatus are concertedly performed while the primary operation of the exposure apparatus is stopped.

19. A method comprising:

obtaining, by a computer, information on maintenance of an exposure apparatus;

obtaining, by a computer, information on maintenance of a substrate processing apparatus inline connected to the exposure apparatus; and based on the obtained information on maintenance of the exposure apparatus and the obtained information on maintenance of the substrate processing apparatus, stopping, by a computer, a primary operation of the exposure apparatus, and performing management, by a computer, so that maintenance work in both of the exposure apparatus and the substrate processing apparatus is concertedly performed while the primary operation of the exposure apparatus is stopped, to thereby optimize maintenance timing of both the exposure apparatus and the substrate processing apparatus and reduce downtime of the exposure apparatus.

* * * * *

UNITED STATES PATENT AND TRADEMARK OFFICE
CERTIFICATE OF CORRECTION

PATENT NO. : 7,692,764 B2
APPLICATION NO. : 11/660906
DATED : April 6, 2010
INVENTOR(S) : Yousuke Shirata It is certified that error appears in the above-identified patent and that said Letters Patent is hereby corrected as shown below:

Column 30, Line 45, after "both" insert --the--.

Column 31, Line 32, after "method for" insert --a--.

Signed and Sealed this

Twenty-second Day of June, 2010

David J. Kappos
*Director of the United States Patent and Trademark Office*